United States Patent
Kim

(10) Patent No.: US 11,205,390 B2
(45) Date of Patent: Dec. 21, 2021

(54) DISPLAY DEVICE

(71) Applicant: Samsung Display Co., Ltd., Yongin-si (KR)

(72) Inventor: Hwa Jeong Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/840,971

(22) Filed: Apr. 6, 2020

(65) Prior Publication Data

US 2021/0027717 A1     Jan. 28, 2021

(30) Foreign Application Priority Data

Jul. 25, 2019 (KR) .................. 10-2019-0090393

(51) Int. Cl.
   *G09G 3/32* (2016.01)
   *G09G 3/3275* (2016.01)
   *H01L 27/32* (2006.01)

(52) U.S. Cl.
   CPC ......... *G09G 3/3275* (2013.01); *H01L 27/326* (2013.01); *H01L 27/3276* (2013.01)

(58) Field of Classification Search
   CPC . G09G 3/3275; H01L 27/1218; H01L 27/124; H01L 27/3216; H01L 27/326; H01L 27/3276
   USPC .................................................. 345/170–178
   See application file for complete search history.

(56) References Cited

U.S. PATENT DOCUMENTS

| | | | |
|---|---|---|---|
| 10,139,969 B2* | 11/2018 | Kang | ................... G06F 3/0443 |
| 10,312,309 B2 | 6/2019 | Lin et al. | |
| 2006/0139551 A1 | 6/2006 | Kimura | |
| 2006/0232738 A1 | 10/2006 | Lin et al. | |

(Continued)

FOREIGN PATENT DOCUMENTS

| | | |
|---|---|---|
| CN | 106707646 | 5/2017 |
| CN | 206541551 | 10/2017 |

(Continued)

OTHER PUBLICATIONS

Extended European Search Report dated Dec. 15, 2020, in European Patent Application No. 20182990.0.

*Primary Examiner* — Tony O Davis
(74) *Attorney, Agent, or Firm* — H.C. Park & Associates, PLC

(57) ABSTRACT

A display device includes: an active region including pixels that receive data signals from data lines, the pixels being arranged in a matrix formation; a non-active region adjacent to the active region in a first direction and including a pad portion, the non-active fan-out wirings being in the non-active region and connected to the pad portion; signal wirings extending in the first direction, crossing the active region, and being connected to the pixels; and connection wirings at least partially passing through the active region and connecting some of the non-active fan-out wirings to some of the signal wirings, respectively. The non-active fan-out wirings include first non-active fan-out wirings made of a first conductive layer, and second non-active fan-out wirings made of a second conductive layer different from the first conductive layer. The first and second non-active fan-out wirings being alternately arranged along a second direction intersecting the first direction.

23 Claims, 21 Drawing Sheets

(56) References Cited

U.S. PATENT DOCUMENTS

| | | | | |
|---|---|---|---|---|
| 2011/0085122 A1* | 4/2011 | Fu | ................... | G02F 1/13452 |
| | | | | 349/149 |
| 2014/0022148 A1* | 1/2014 | Kim | ................... | G09G 3/2092 |
| | | | | 345/55 |
| 2019/0206976 A1 | 7/2019 | Jeong et al. | | |
| 2019/0214450 A1 | 7/2019 | Lee et al. | | |
| 2019/0348489 A1* | 11/2019 | Na | ................... | H01L 27/124 |
| 2019/0355765 A1* | 11/2019 | Li | ................... | G02F 1/1362 |
| 2020/0319739 A1* | 10/2020 | Zou | ................... | G02F 1/133514 |
| 2020/0411558 A1* | 12/2020 | Zhang | ................... | H01L 27/124 |
| 2021/0013287 A1* | 1/2021 | Bang | ................... | H01L 27/3276 |

FOREIGN PATENT DOCUMENTS

| | | |
|---|---|---|
| CN | 109541865 | 3/2019 |
| KR | 10-2006-0110200 | 10/2006 |
| WO | 2017/127563 | 7/2017 |
| WO | 2019/037529 | 2/2019 |

* cited by examiner

DISPLAY DEVICE

CROSS-REFERENCE TO RELATED APPLICATION

This application claims priority to and the benefit of Korean Patent Application No. 10-2019-0090393, filed Jul. 25, 2019, which is hereby incorporated by reference for all purposes as if fully set forth herein.

BACKGROUND

Field

Exemplary embodiments generally relate to a display device.

Discussion

Display devices are becoming increasingly important with the development of multimedia. Accordingly, various types of display devices, such as organic light-emitting displays, liquid crystal displays, and the like, are being used. A display device typically includes an active region where an image is displayed and a non-active region outside (e.g., disposed around) the active region. In the non-active region, wirings for transmitting signals to the active region are disposed. The wirings may fan out from a pad portion and then extend toward the active region. In addition, display devices having thin bezels are typically preferred. However, if the area of the non-active region is reduced too much so as to realize a thin bezel, there may be fewer paths through which the fanned-out wirings can pass. To secure the paths of the fanned-out wirings even in a thin-bezel structure, some of the fanned-out wirings may be made to pass through the active region. However, if the fanned-out wirings pass through the active region, the order of data signals may be changed, thus requiring additional mapping of a driver chip. Also, signal wirings may include a different conductive layer in each region, in which case there may be a difference in luminance between regions due to process dispersion of each conductive layer.

The above information disclosed in this section is only for understanding the background of the inventive concepts, and, therefore, may contain information that does not form prior art.

SUMMARY

Some exemplary embodiments are capable of providing a display device including connection wirings passing through an active region, but can employ a general-purpose driver chip and can reduce a difference in luminance between regions due to process dispersion of a conductive layer.

Additional aspects will be set forth in the detailed description which follows, and, in part, will be apparent from the disclosure, or may be learned by practice of the inventive concepts.

According to an exemplary embodiment, a display device includes an active region, a non-active region, non-active fan-out wirings, signal wirings, and connection wirings. The active region includes pixels configured to receive data signals from data lines. The pixels are arranged in a matrix formation. The non-active region is adjacent to the active region in a first direction. The non-active region includes a pad portion. The non-active fan-out wirings are in the non-active region and are connected to the pad portion. The signal wirings extend in the first direction and cross the active region. The signal wirings are connected to the pixels. The connection wirings at least partially pass through the active region and connect some of the non-active fan-out wirings to some of the signal wirings, respectively. The non-active fan-out wirings include first non-active fan-out wirings made of a first conductive layer, and second non-active fan-out wirings made of a second conductive layer different from the first conductive layer. The first non-active fan-out wirings and the second non-active fan-out wirings are alternately arranged along a second direction intersecting the first direction.

According to an exemplary embodiment, a display device having an active region and a non-active region adjacent to the active region in a first direction, includes non-active fan-out wirings, signal wirings, and active fan-out wirings. The non-active fan-out wirings are in the non-active region. The non-active fan-out wirings include first non-active fan-out wirings and second non-active fan-out wirings alternately arranged along a second direction intersecting the first direction. The signal wirings are in the active region. The signal wirings include first signal wirings and second signal wirings alternately arranged along the second direction. The active fan-out wirings pass through the active region. The first non-active fan-out wirings are made of a first conductive layer. The second non-active fan-out wirings are made of a second conductive layer. The signal wirings are made of a third conductive layer. The active fan-out wirings are made of a fourth conductive layer. The first conductive layer, the second conductive layer, the third conductive layer, and the fourth conductive layer are different conductive layers. A first portion of the first signal wirings is connected to the first non-active fan-out wirings through the active fan-out wirings to form first outer data lines. A remaining portion of the first signal wirings is connected to the first non-active fan-out wirings without the active fan-out wirings to form first inner data lines. A first portion of the second signal wirings is connected to the second non-active fan-out wirings through the active fan-out wirings to form second outer data lines. A remaining portion of the second signal wirings is connected to the second non-active fan-out wirings without the active fan-out wirings to form second inner data lines.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts. In the drawings.

DETAILED DESCRIPTION OF SOME EXEMPLARY EMBODIMENTS

Figure 1:
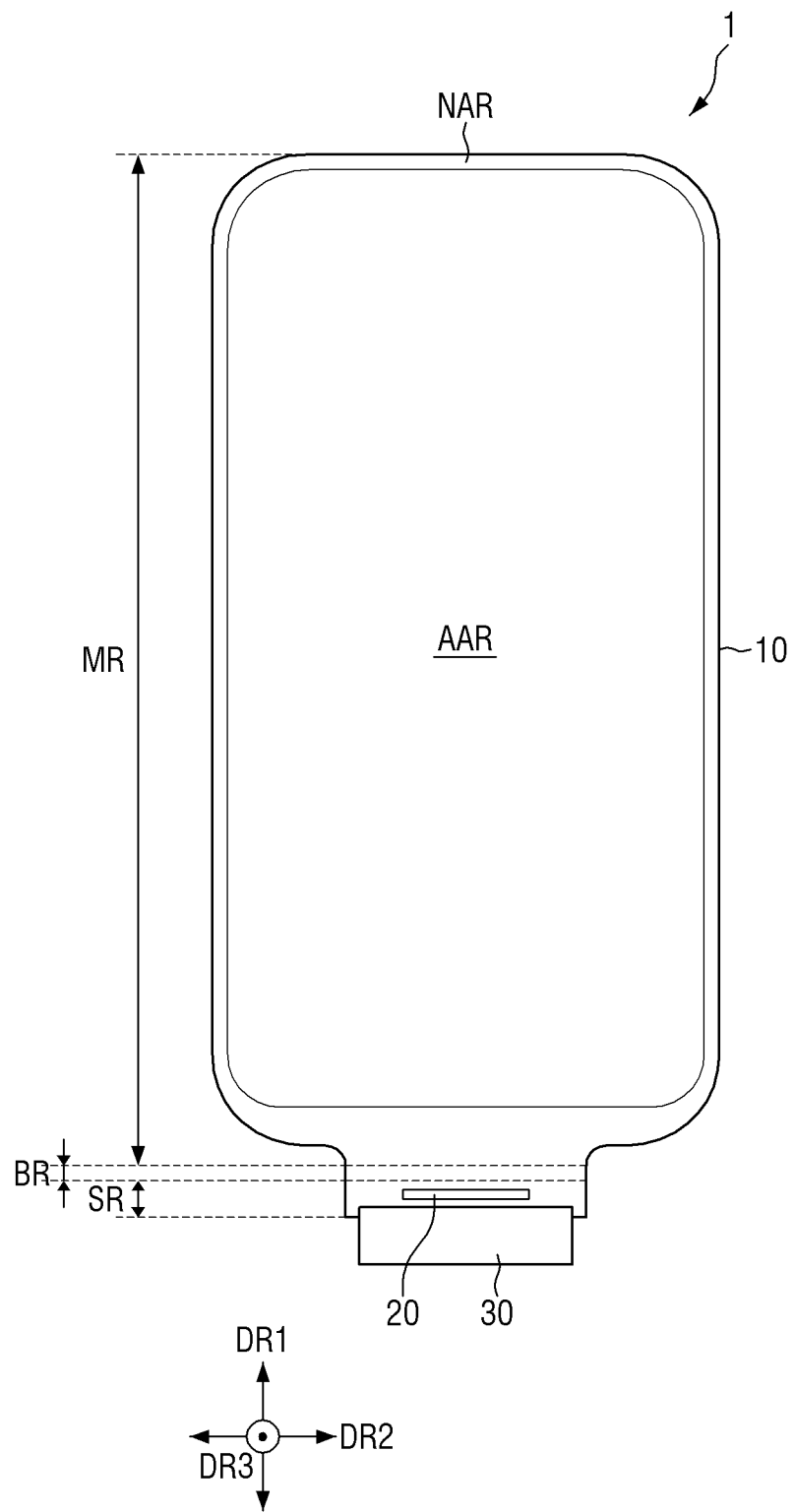
FIG. 1 is a plan view of a display device according to an exemplary embodiment.

In the following description, for the purposes of explanation, numerous specific details are set forth in order to provide a thorough understanding of various exemplary embodiments. As used herein, the terms "embodiments" and "implementations" are used interchangeably and are non-limiting examples employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Hereinafter, various exemplary embodiments will be explained in detail with reference to the accompanying drawings.

FIG. 1 is a plan view of a display device according to an exemplary embodiment.

Figure 2:
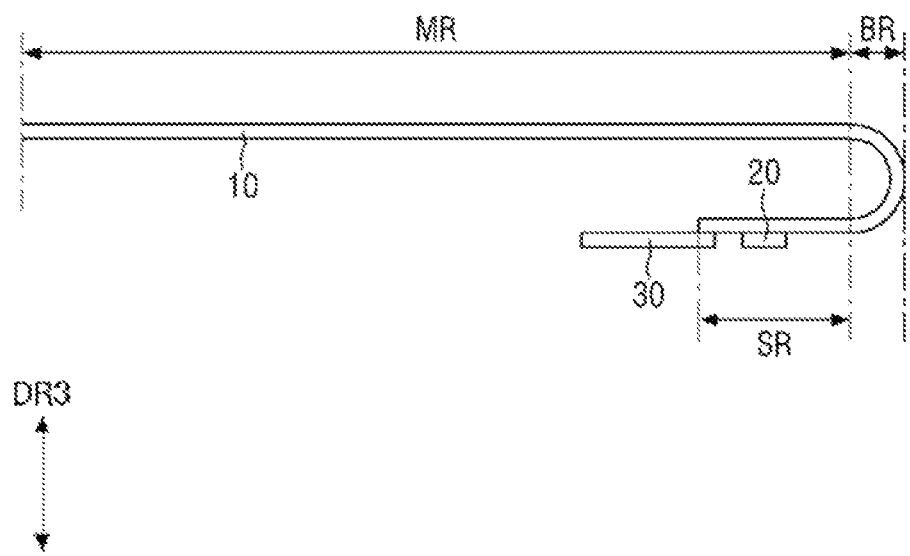
FIG. 2 is a side view of the display device of FIG. 1 according to an exemplary embodiment.

FIG. 1 illustrates a planar shape of a display device 1 before being bent. In the drawing, a first direction DR1 indicates a vertical direction in plan view, a second direction DR2 indicates a horizontal direction in plan view, and a third direction DR3 indicates a thickness direction in plan view. FIG. 2 is a side view of the display device of FIG. 1 according to an exemplary embodiment. FIG. 2 illustrates a lateral shape of the display device 1 after being bent in a thickness direction, e.g., the third direction DR3.

Referring to FIGS. 1 and 2, the display device 1 is a device for displaying moving images and/or still images. The display device 1 may be used as a display screen in (or in association with) any suitable device, such as portable electronic devices, e.g., mobile phones, smartphones tablet personal computers (PCs), smart watches, watch phones, mobile communication terminals, electronic notebooks, electronic books, portable multimedia players (PMPs), navigation systems and ultra-mobile PCs (UMPCs), as well as in various other products, e.g., televisions, notebook computers, monitors, billboards, Internet of things (IoT) devices, etc.

The display device 1 may include a display panel 10. The display panel 10 may be a flexible substrate including a flexible polymer material, such as polyimide, but exemplary embodiments are not limited thereto. Accordingly, the display panel 10 can be bent, curved, folded, rolled, twisted, etc.

The display panel 10 may include an active region AAR where a screen is displayed and a non-active region NAR where no screen is displayed. The display panel 10 may be divided into the active region AAR and the non-active region NAR in plan view. The non-active region NAR may surround the active region AAR.

Figure 3:
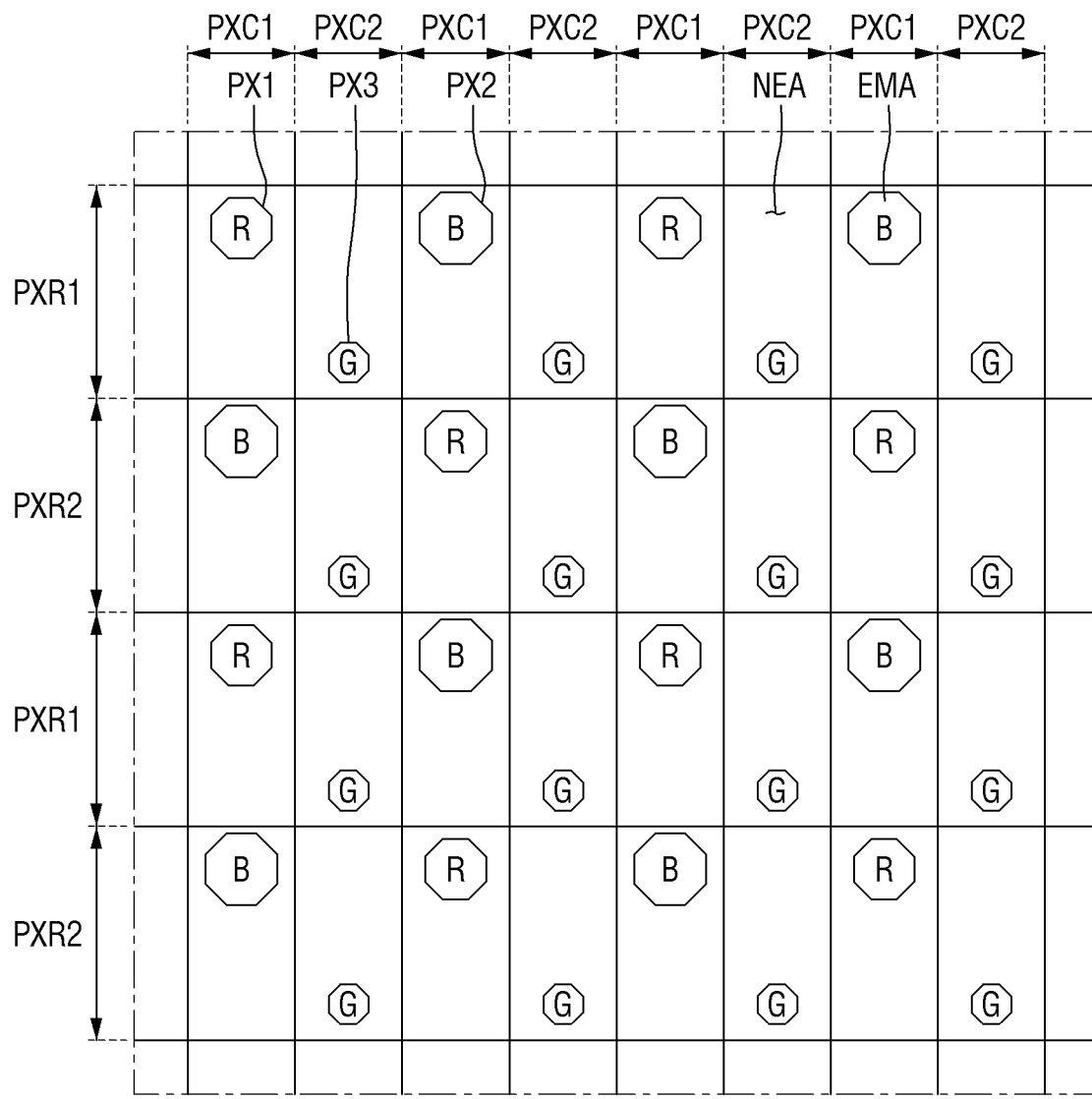
FIG. 3 is a layout view illustrating a pixel arrangement of the display device of FIG. 1 according to an exemplary embodiment.

The active region AAR may include a plurality of pixels PX (e.g., pixels PX1 through PX3 in FIG. 3). The pixels PX may be arranged in a matrix, such as pentile arrangement. Although not shown, each of the pixels PX may include a light-emitting layer and a circuit layer, which controls the amount of light emitted from the light-emitting layer. The circuit layer may include wirings, electrodes, and at least one transistor. The light-emitting layer may include an organic light-emitting material. The light-emitting layer may be sealed by an encapsulation layer. An exemplary configuration of each pixel PX will be described later.

The display panel 10 may include a main region MR and a bending region BR connected to a first side of the main region MR in the first direction DR1. The display panel 10 may further include a sub-region SR, which is connected to the bending region BR on a first side in the first direction DR1 and is bent in the thickness direction to overlap the main region MR in the thickness direction, e.g., the third direction DR3.

The main region MR may include the active region AAR. The non-active region NAR may be located in an edge portion around the active region AAR of the main region MR.

The main region MR may have a shape similar to the planar shape of the display device 1. The main region MR may be a flat region located in one plane. However, exemplary embodiments are not limited to this case, and at least one of edges of the main region MR excluding an edge (or side) connected to the bending region BR may also be curved or may be bent perpendicularly.

If at least one of the edges of the main region MR excluding the edge (or side) connected to the bending region BR is curved or bent, the active region AAR may also be disposed at the curved or bent edge. However, exemplary embodiments are not limited to this case, and the curved or bent edge may also be the non-active region NAR where no screen is displayed or may include a combination of the active region AAR and the non-active region NAR.

The non-active region NAR of the main region MR may extend from an outer boundary of the active region AAR to edges of the display panel 10. Signal wirings and/or driving circuits for transmitting signals to the active region AAR may be disposed in the non-active region NAR of the main region MR.

The bending region BR may be connected to a short side of the main region MR. A width (in the second direction DR2) of the bending region BR may be smaller than a width of the main region MR, e.g., a width of the short side of the main region MR. A connection portion of the main region MR and the bending region BR may have an L-cut shape to reduce a width of a bezel.

In the bending region BR, the display panel 10 may be bent with a curvature in a direction opposite to a display surface, e.g., in the third direction DR3. As the display panel 10 is bent in the bending region BR, a surface of the display panel 10 may be reversed. That is, a surface of the display panel 10 which faces upward may be changed to face laterally outward through the bending region BR and then to face downward.

The sub-region SR extends from the bending region BR. After the completion of bending, the sub-region SR may extend parallel to the main region MR. The sub-region SR may overlap the main region MR in the thickness direction, e.g., the third direction DR3, of the display panel 10. The sub-region SR may overlap the non-active region NAR at an edge of the main region MR and may further overlap the active region AAR of the main region MR. A width of the sub-region SR may be, but is not necessarily, equal to the width of the bending region BR.

A pad portion PDR (see FIG. 6) may be disposed in the sub-region SR of the display panel 10. External devices may be mounted (e.g., attached) on the pad portion PDR. Examples of the external devices include a driver chip 20 and a driving board made of a flexible printed circuit board or a rigid printed circuit board. In addition, a wiring connection film, a connector, etc., may be mounted on the pad portion PDR as external devices. Only one external device or a plurality of external devices may be mounted on the sub-region SR. For example, as illustrated in FIGS. 1 and 2, the driver chip 20 may be disposed on the sub-region SR of the display panel 10, and the driving board 30 may be attached to an end of the sub-region SR. In this case, the display panel 10 may include both a pad portion connected to the driver chip 20 and a pad portion connected to the driving board 30. In an exemplary embodiment, a driver chip may be mounted on a film, and the film may be attached to the sub-region SR of the display panel 10.

The driver chip 20 may be mounted on a surface of the display panel 10 that is the same surface as the display surface (or a same side of the display panel 10 as the display surface). As the surface of the display panel 10 is reversed by the bending of the bending region BR as described above, an upper surface of the driver chip 20 mounted on the surface of the display panel 10 facing downward in the thickness direction may face downward.

The driver chip 20 may be attached onto the display panel 10 by an anisotropic conductive film or may be attached onto the display panel 10 by ultrasonic bonding. A horizontal width of the driver chip 20 may be smaller than a horizontal width of the display panel 10. The driver chip 20 may be disposed in a central portion of the sub-region SR in the horizontal direction (e.g., the second direction DR2), and left and right edges of the driver chip 20 may be spaced apart from left and right edges of the sub-region SR, respectively.

The driver chip 20 may include an integrated circuit for driving the display panel 10. In an exemplary embodiment, the integrated circuit may be a data driver integrated circuit, which generates and provides data signals. The driver chip 20 is connected to wiring pads WR_PD (see FIG. 6) provided in the pad portion PDR of the display panel 10 and provides data signals to the wiring pads WR_PD. Wirings WR (see FIG. 6) connected to the wiring pads WR_PD extend toward the pixels PX and transmit the data signals to the pixels PX.

FIG. 3 is a layout view illustrating a pixel arrangement of the display device of FIG. 1 according to an exemplary embodiment.

Referring to FIG. 3, the pixels PX include first color pixels PX1, second color pixels PX2, and third color pixels PX3. In an exemplary embodiment, the first color pixels PX1 may be red pixels, the second color pixels PX2 may be blue pixels, and the third color pixels PX3 may be green pixels. The pixels PX may be alternately arranged in a matrix formation, e.g., a pentile formation.

Each of the pixels PX may include a light-emitting region EMA and a non-light-emitting region NEA surrounding the light-emitting region EMA. The light-emitting region EMA may have a different size in at least one of the first to third color pixel PX1, PX2 and PX3, such as in each of the first to third color pixels PX1, PX2, and PX3. For example, the light-emitting region EMA of each second color pixel PX2 may be larger than the light-emitting region EMA of each first color pixel PX1, and the light-emitting region EMA of each third color pixel PX3 may be smaller than the light-emitting region EMA of each first color pixel PX1. The light-emitting region EMA of each pixel PX may have a substantially octagonal shape; however, the light-emitting region EMA of each pixel PX is not limited to the octagonal shape and can have various shapes, such as a hexagon, a circle, a rhombus, or other polygon, or a polygon with rounded corners.

In some pixel columns PXC (hereinafter, referred to as first pixel columns PXC1), the first color pixels PX1 and the second color pixels PX2 are alternately arranged along the first direction DR1 (e.g., a column direction). In other pixel columns PXC (hereinafter, referred to as second pixel columns PXC2), the third color pixels PX3 are repeatedly arranged. The first pixel columns PXC1 and the second pixel columns PXC2 are alternately arranged along the second direction DR2 (e.g., a row direction). For example, odd-numbered pixel columns PXC may be the first pixel columns PXC1, and even-numbered pixel columns PXC may be the second pixel columns PXC2.

Each light-emitting region EMA belonging to one pixel column PXC may be substantially aligned along the first direction DR1. The light-emitting regions EMA in one pixel column PXC may be staggered with respect to the light-emitting regions EMA in a neighboring pixel column PXC. For example, the first color pixels PX1 and the second color pixels PX2 in each first pixel column PXC1 may be aligned along the second direction DR2 with spaces between adjacent third color pixels PX3 in an adjacent second pixel column PXC2, and the third color pixels PX3 in each second pixel column PXC2 may be aligned along the second direction DR2 with spaces between adjacent first and second color pixels PX1 and PX2 in an adjacent first pixel column PXC1.

In pixel rows PXR, the first color pixels PX1 and the second color pixels PX2 are alternately arranged with the third color pixels PX3 interposed between them. In each first pixel row PXR1, a first color pixel PX1, a third color pixel PX3, a second color pixel PX2, and a third color pixel PX3 may be repeatedly arranged in this order. In each second pixel row PXR2, a second color pixel PX2, a third color pixel PX3, a first color pixel PX1, and a third color pixel PX3 may be repeatedly arranged in this order. The first pixel rows PXR1 and the second pixel rows PXR2 are alternately arranged along the first direction DR1. For example, odd-numbered pixel rows PXR may be the first pixel rows PXR1, and even-numbered pixel rows PXR may be the second pixel rows PXR2. In one pixel row PXR, the light-emitting regions EMA of the first color pixels PX1 and the second color pixels PX2 may be located relatively on a second side in the first direction DR1 as compared with the light-emitting regions EMA of the third color pixels PX3. That is, the respective light-emitting regions EMA of the pixels PX in each pixel row PXR may be arranged in a zigzag shape along the second direction DR2.

Figure 4:
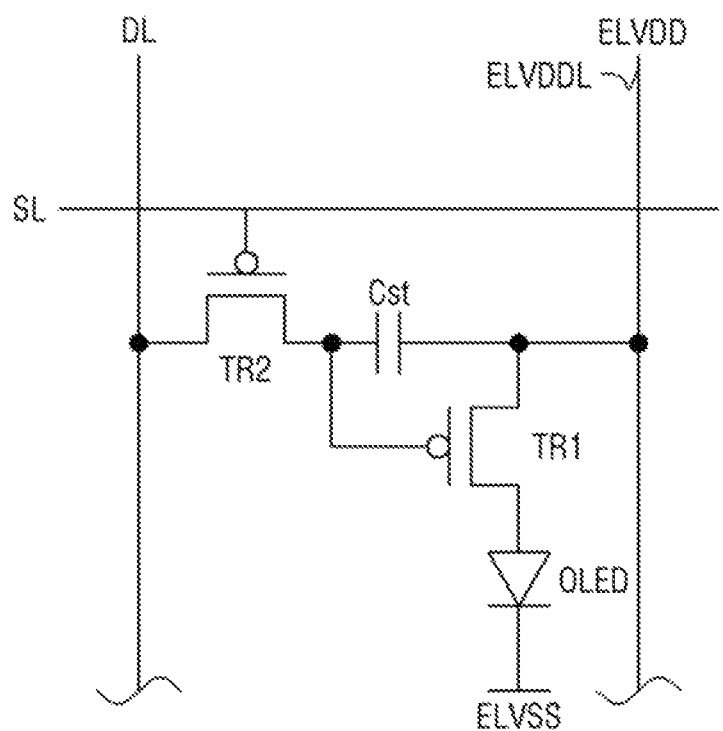
FIG. 4 is a circuit diagram of one pixel of the display device of FIG. 1 according to an exemplary embodiment.

Pixels PX belonging to the same column may receive a data signal from the same data line, and pixels PX belonging to the same row may receive a gate signal from the same gate line. Each pixel PX may be driven by a pixel circuit. The pixel circuit may include a plurality of transistors and at least one capacitor. In FIG. 4, a circuit diagram of an example pixel circuit is illustrated.

FIG. 4 is a circuit diagram of one pixel PX of the display device according to an exemplary embodiment.

Referring to FIG. 4, a pixel circuit may include a first transistor TR1, a second transistor TR2, a capacitor Cst, and an organic light-emitting diode OLED. Each pixel circuit is connected to a scan (or gate) line SL, a data line DL, and a first power supply voltage line ELVDDL.

The first transistor TR1 may be a driving transistor, and the second transistor TR2 may be a switching transistor. Although the first transistor TR1 and the second transistor TR2 are all p-channel metal oxide semiconductor (PMOS) transistors in the drawing, any one or both of the first transistor TR1 and the second transistor TR2 may also be an n-channel metal oxide semiconductor (NMOS) transistor.

A first electrode (e.g., source electrode) of the first transistor TR1 is connected to the first power supply voltage line ELVDDL, and a second electrode (e.g., drain electrode) of the first transistor TR1 is connected to a pixel electrode (e.g., anode) of the organic light-emitting diode OLED. A first electrode (e.g., source electrode) of the second transistor TR2 is connected to the data line DL, and a second electrode (e.g., drain electrode) of the second transistor TR2 is connected to a gate electrode of the first transistor TR1. The capacitor Cst is connected between the gate electrode and the first electrode of the first transistor TR1. A common electrode (e.g., cathode) of the organic light-emitting diode OLED receives a second power supply voltage ELVSS. The second power supply voltage ELVSS may be lower than a first power supply voltage ELVDD provided by the first power supply voltage line ELVDDL.

The second transistor TR2 may output a data signal transmitted to the data line DL in response to a scan signal transmitted to the scan line SL. The capacitor Cst may be charged with a voltage corresponding to the data signal received from the second transistor TR2. The first transistor TR1 may control a driving current flowing through the organic light-emitting diode OLED according to the amount of charge stored in the capacitor Cst.

The equivalent circuit of FIG. 4 is merely one example, and the pixel circuit may also include a greater number of transistors (e.g., seven) and capacitors.

Figure 5:
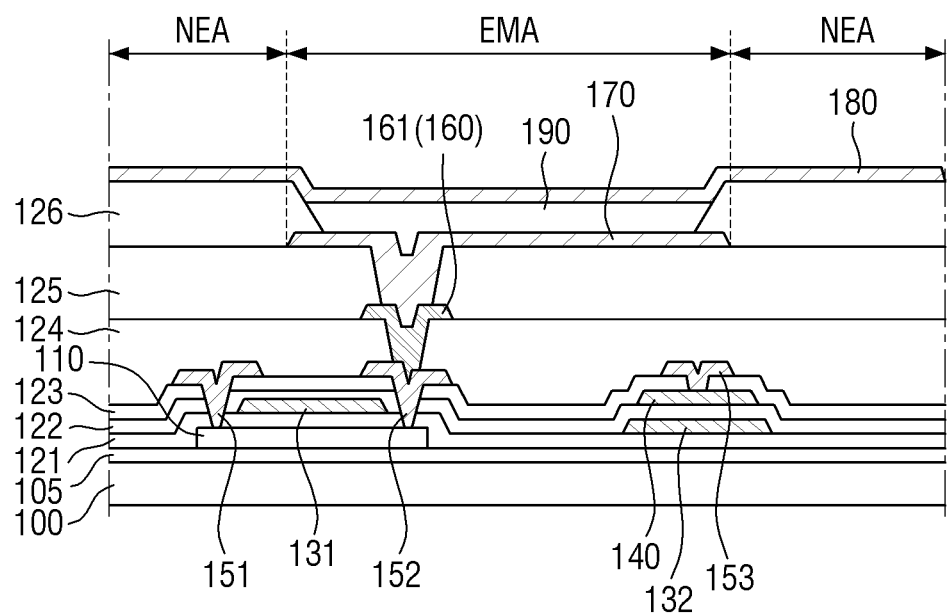
FIG. 5 is a cross-sectional view of one pixel of the display device of FIG. 1 according to an exemplary embodiment.

FIG. 5 is a cross-sectional view of one pixel PX of the display device of FIG. 1 according to an exemplary embodiment. In FIG. 5, the first transistor TR1 among the two transistors of FIG. 4 is illustrated in the form of a thin-film transistor, and the second transistor TR2 is not illustrated. The cross-sectional structure of the pixel PX will now be described in detail with reference to FIG. 5.

The display panel 10 may include a substrate 100, a buffer layer 105, a semiconductor layer 110, a first insulating layer 121, a first gate conductive layer 130, a second insulating layer 122, a second gate conductive layer 140, a third insulating layer 123, a first data conductive layer 150, a fourth insulating layer 124, a second data conductive layer 160, a fifth insulating layer 125, a pixel electrode 170, a pixel defining layer 126 including an opening that exposes the pixel electrode 170, an organic layer 190 disposed in the opening of the pixel defining layer 126, and a common electrode 180 disposed on the organic layer 190 and the pixel defining layer 126. Each of the above layers may individually be a single layer or a stack of a plurality of layers. At least one other layer may also be disposed between any two of the aforementioned layers.

The substrate 100 supports each layer disposed on the substrate 100. The substrate 100 may be made of an insulating material, such as polymer resin. The polymer material may be, for example, at least one of polyethersulfone (PES), poly acrylate (PA), polyarylate (PAR), polyetherimide (PET), polyethylene naphthalate (PEN), polyethylene terephthalate (PET), polyphenylene sulfide (PPS), polyallylate, polyimide (PI), polycarbonate (PC), cellulose triacetate (CAT), and cellulose acetate propionate (CAP), or a combination of these materials. The substrate 100 may be a flexible substrate that can be bent, folded, flexed, rolled, twisted, etc. The material that forms the flexible substrate may be, but is not limited to, polyimide (PI).

The buffer layer 105 is disposed on the substrate 100. The buffer layer 105 may prevent (or mitigate) diffusion of impurity ions, prevent penetration of moisture or outside air, and perform a surface planarization function. The buffer layer 105 may include at least one of silicon nitride, silicon oxide, and silicon oxynitride. The buffer layer 105 can be omitted depending on the type of the substrate 100 or processing conditions.

The semiconductor layer 110 is disposed on the buffer layer 105. The semiconductor layer 110 forms a channel of a thin-film transistor of the pixel PX. The semiconductor layer 110 may include polycrystalline silicon. However, the material of the semiconductor layer 110 is not limited to polycrystalline silicon, and the semiconductor layer 110 may include monocrystalline silicon, low-temperature polycrystalline silicon, amorphous silicon, or an oxide semiconductor. Examples of the oxide semiconductor may include a binary compound ($AB_x$) a ternary compound ($AB_xC_y$), and a quaternary compound ($AB_xC_yD_z$) containing, for instance, at least one of indium, zinc, gallium, tin, titanium, aluminum, hafnium (Hf), zirconium (Zr), magnesium (Mg), etc.

The first insulating layer 121 may be a gate insulating layer having a gate insulating function. The first insulating layer 121 may include a silicon compound, a metal oxide, or the like. For example, the first insulating layer 121 may include at least one of silicon oxide, silicon nitride, silicon oxynitride, aluminum oxide, tantalum oxide, hafnium oxide, zirconium oxide, and titanium oxide, or the like. These materials may be used alone or in combination with each other. The first insulating layer 121 may be a single layer or a multilayer consisting of stacked layers of different materials.

The first insulating layer 121 is disposed on the semiconductor layer 110. The first insulating layer 121 may substantially be disposed over the entire surface of the substrate 100.

The first gate conductive layer 130 is disposed on the first insulating layer 121. The first gate conductive layer 130 may include a gate electrode 131 of the thin-film transistor of the pixel PX, a scan line SL connected to the gate electrode 131, and a first storage capacitor electrode 132. Second non-active fan-out wirings NFW_2 (see FIG. 8) of the non-active region NAR may also be made of the first gate conductive layer 130.

The first gate conductive layer 130 may include one or more metals, such as at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first gate conductive layer 130 may be a single layer or a multilayer structure.

The second insulating layer 122 may be disposed on the first gate conductive layer 130. The second insulating layer 122 may be an interlayer insulating layer or a second gate insulating layer. The second insulating layer 122 may include an inorganic insulating material, such as at least one of silicon oxide, silicon nitride, silicon oxynitride, hafnium oxide, aluminum oxide, titanium oxide, tantalum oxide, and zinc oxide.

The second gate conductive layer 140 is disposed on the second insulating layer 122. The second gate conductive layer 140 may include a second storage capacitor electrode 140. Second non-active fan-out wirings NFW_2 (see FIG. 8) of the non-active region NAR may also be made of the second gate conductive layer 140. The second gate conductive layer 140 may include one or more metals, such as at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second gate conductive layer 140 may be made of, but is not limited to, the same material as the first gate conductive layer 130. The second gate conductive layer 140 may be a single layer or a multilayer structure.

The third insulating layer 123 is disposed on the second gate conductive layer 140. The third insulating layer 123 may be an interlayer insulating layer. The third insulating layer 123 may include an inorganic insulating material, such as at least one of silicon oxide, silicon nitride, silicon oxynitride, hafnium oxide, aluminum oxide, titanium oxide, tantalum oxide, and zinc oxide, or an organic insulating material, such as at least one of a polyacrylate resin, epoxy resin, phenolic resin, polyamide resin, polyimide resin, unsaturated polyester resin, polyphenylene ether resin, polyphenylene sulfide resin, and benzocyclobutene (BCB). The third insulating layer 123 may be a single layer or a multilayer structure consisting of stacked layers of different materials.

The first data conductive layer 150 is disposed on the third insulating layer 123. The first data conductive layer 150 may be a first source/drain conductive layer. The first data conductive layer 150 may include a first electrode 151 and a second electrode 152 of the thin-film transistor of the pixel PX. Signal wirings SW1 and SW2 (see FIG. 8) may also be made of the first data conductive layer 150. The first electrode 151 and the second electrode 152 of the thin-film transistor may be electrically connected to a source region and a drain region of the semiconductor layer 110 through contact holes penetrating the third insulating layer 123, the second insulating layer 122, and the first insulating layer 121. A first power supply voltage electrode 153 of the pixel PX may also be made of the first data conductive layer 150.

The first data conductive layer 150 may include one or more metals, such as at least one of from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first data conductive layer 150 may be a single layer or a multilayer structure. For example, the first data conductive layer 150 may have a stacked structure of Ti/Al/Ti, Mo/Al/Mo, Mo/AlGe/Mo, or Ti/Cu.

The fourth insulating layer 124 is disposed on the first data conductive layer 150. The fourth insulating layer 124 covers the first data conductive layer 150. The fourth insulating layer 124 may be an interlayer insulating layer or a via layer. The fourth insulating layer 124 may include an organic insulating material, such as at least one of a polyacrylate resin, epoxy resin, phenolic resin, polyamide resin, polyimide resin, unsaturated polyester resin, polyphenylene ether resin, polyphenylene sulfide resin, and benzocyclobutene (BCB).

The second data conductive layer 160 is disposed on the fourth insulating layer 124. The second data conductive layer 160 may be a second source/drain conductive layer. The second data conductive layer 160 may include a connection electrode 161 of the pixel PX. Connection wirings CNW (see FIG. 8) may also be made of the second data conductive layer 160. The connection electrode 161 may be electrically connected to the second electrode 152 of the thin-film transistor of the pixel PX through a contact hole penetrating the fourth insulating layer 124.

The second data conductive layer 160 may include one or more metals, such as at least one of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second data conductive layer 160 may be a single layer or a multilayer structure. The second data conductive layer 160 may be made of, but is not limited to, the same material as the first data conductive layer 150.

The fifth insulating layer 125 is disposed on the second data conductive layer 160. The fifth insulating layer 125 covers the second data conductive layer 160. The fifth insulating layer 125 may be a via layer. The fifth insulating layer 125 may include the same material as the fourth insulating layer 124 described above or may include one or more materials selected from the materials exemplified as the material of the fourth insulating layer 124.

The pixel electrode 170 is disposed on the fifth insulating layer 125. The pixel electrode 170 may be an anode of a light-emitting element, e.g., the organic light-emitting diode OLED (see FIG. 4). The pixel electrode 170 may be electrically connected to the connection electrode 161 made of the second data conductive layer 160 through a contact hole penetrating the fifth insulating layer 125 and may be connected to the second electrode 152 of the thin-film transistor through the connection electrode 161. The pixel electrode 170 may at least partially overlap the light-emitting region EMA of the pixel PX.

The pixel electrode 170 may have, but is not limited to, a stacked structure in which a material layer having a high work function, such as indium tin oxide (ITO), indium zinc oxide (IZO), zinc oxide (ZnO), or indium oxide ($In_2O_3$), and a reflective material layer, such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) or a mixture of at least two of the same are stacked. The material layer having a high work function may be disposed on the reflective material layer to be closer to the organic layer 190 than the reflective material. The pixel electrode 170 may have a multilayer structure of, but is not limited to, ITO/Mg, ITO/$MgF_2$, ITO/Ag, or ITO/Ag/ITO.

The pixel defining layer 126 may be disposed on the pixel electrode 170. The pixel defining layer 126 may at least partially overlap the non-light-emitting region NEA of the pixel PX. The pixel defining layer 126 may include the opening that exposes at least a portion of the pixel electrode 170. The pixel defining layer 126 may include an inorganic insulating material, such as at least one of silicon oxide, silicon nitride, silicon oxynitride, hafnium oxide, aluminum oxide, titanium oxide, tantalum oxide, and zinc oxide, or an organic insulating material, such as at least one of a polyacrylate resin, epoxy resin, phenolic resin, polyamide resin, polyimide resin, unsaturated polyester resin, polyphenylene ether resin, polyphenylene sulfide resin, and benzocyclobutene (BCB). The pixel defining layer 126 may be a single layer or a multilayer structure consisting of stacked layers of different materials.

A light-emitting layer is disposed in the opening of the pixel defining layer 126. The light-emitting layer may be made of an inorganic material or an organic material. In an exemplary embodiment, the light-emitting layer may include the organic layer 190. The organic layer 190 may include an organic light-emitting layer, a hole injection/transport layer, and an electron injection/transport layer. The organic layer 190 may overlap the light-emitting region EMA.

The common electrode 180 is disposed on the organic layer 190 and the pixel defining layer 126. The common electrode 180 may be a cathode of the light-emitting element, e.g., the organic light-emitting diode OLED (see FIG. 4). The common electrode 180 may be disposed not only in the light-emitting region EMA but also in the non-light-emitting region NEA of the pixel PX. For instance, the common electrode 180 may be disposed on the entire surface of each pixel PX. The common electrode 180 may include a material layer having a small (or low) work function, such as at least one of Li, Ca, LiF/Ca, LiF/Al, Al, Mg, Ag, Pt, Pd, Ni, Au, Nd, Ir, Cr, $BaF_2$, and Ba, or a compound or mixture of the same (e.g., a mixture of Ag and Mg). The common electrode 180 may further include a transparent metal oxide layer disposed on the material layer having a small work function.

Although not illustrated, an encapsulation layer may be disposed on the common electrode 180. The encapsulation layer may include an inorganic layer. In an exemplary embodiment, the encapsulation layer may include a first inorganic layer, an organic layer disposed on the first inorganic layer, and a second inorganic layer disposed on the organic layer.

Figure 6:
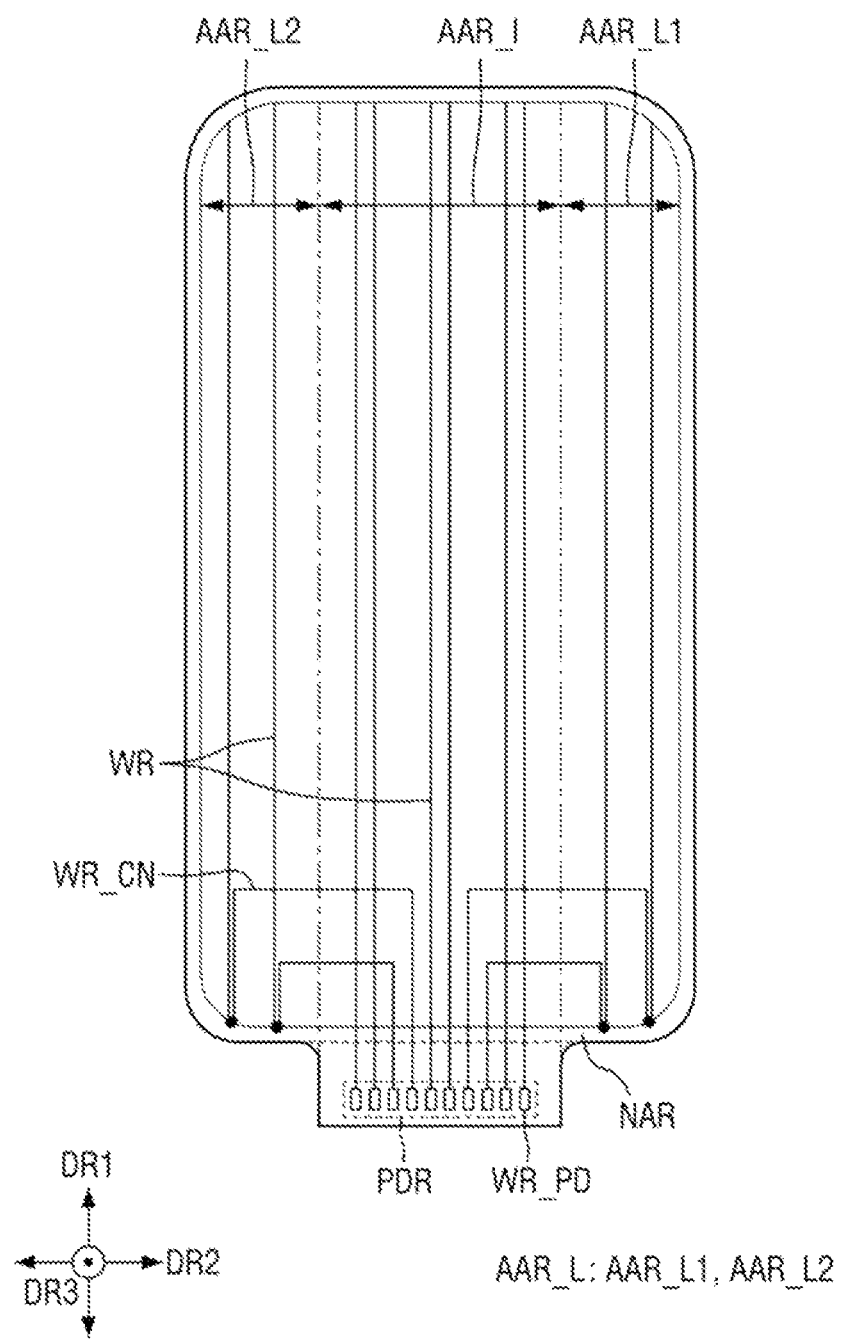
FIG. 6 is a layout view of some wirings of the display device of FIG. 1 according to an exemplary embodiment.

FIG. 6 is a layout view of some wirings of the display device of FIG. 1 according to an exemplary embodiment.

Referring to FIG. 6, a width of a row of the wiring pads WR_PD of the pad portion PDR in the second direction DR2 is smaller than a width of the active region AAR in the second direction DR2. To cover more of the active region AAR, the wirings WR may fan out from the wiring pads WR_PD toward the active region AAR. It may be desirable to arrange the wirings WR in the non-active region NAR adjacent to the active region AAR such that the wirings WR cover the entire active region AAR. However, if the bezel of the display device 1 is reduced, a space in which the wirings WR can fan-out may be insufficient. If the display device 1 has an L-cut shape or if other wirings are disposed at corners, and, thus, the wirings WR cannot pass through the corners, the space for the wirings WR may be further reduced. As a result, a width by which the wirings WR extending from the pad portion PDR are arranged in the second direction DR2 in the non-active region NAR adjacent to the active region AAR may be smaller than the width of the active region AAR.

The active region AAR may be divided into an inner active region AAR_I and an outer active region AAR_L (AAR_L1 and AAR_L2) according to its relative relationship with a region where the wirings WR extending from the pad portion PDR are arranged in the non-active region NAR adjacent to the active region AAR. The inner active region AAR_I may be defined as an active region overlapping the wirings WR, which extend from the pad portion PDR of the non-active region NAR adjacent to the active region AAR, when the wirings WR are extended toward the second side in the first direction DR1. The outer active region AAR_L may be defined as an active region not overlapping the wirings WR, which extend from the pad portion PDR of the non-active region NAR adjacent to the active region AAR, when the wirings WR are extended toward the second side in the first direction DR1. In the drawing, the inner active region AAR_I is located in a central portion of the active region AAR, a first outer active region AAR_L1 is located on a first side of the inner active region AAR_I in the second direction DR2, and a second outer active region AAR_L2 is located on a second side of the inner active region AAR_I in the second direction DR2. However, exemplary embodiments are not limited to this case, and the number, positions, etc., of the inner and outer active regions AAR_I and AAR_L can be variously changed according to the position of the row of the wiring pads WR_PD of the pad portion PDR.

In the inner active region AAR_I, each wiring WR may extend in the first direction DR1 from the non-active region NAR (e.g., an inner non-active region NAR) adjacent to the inner active region AAR_I. Thus, each wiring WR may be disposed adjacent to pixels PX in a corresponding region and may transmit signals to the pixels PX. On the other hand, in the outer active region AAR_L, each wiring WR may extend outward (e.g., toward a first side or a second side in the second direction DR2) to a position from the inner non-active region NAR through a bypass wiring WR_CN and then extend in the first direction DR1 from the position. Thus, each wiring WR may be disposed adjacent to pixels PX in a corresponding region and may transmit signals to the pixels PX. The bypass wirings WR_CN may extend to the non-active region NAR (e.g., an outer non-active region NAR) adjacent to the outer active region AAR_L via the inner active region AAR_I. Since other wirings WR are disposed in the active region AAR through which the bypass wirings WR_CN pass, the bypass wirings WR_CN may be made of a conductive layer located on a different layer from the wirings WR of the active region AAR in order to avoid a short circuit with the wirings WR.

Figure 7:
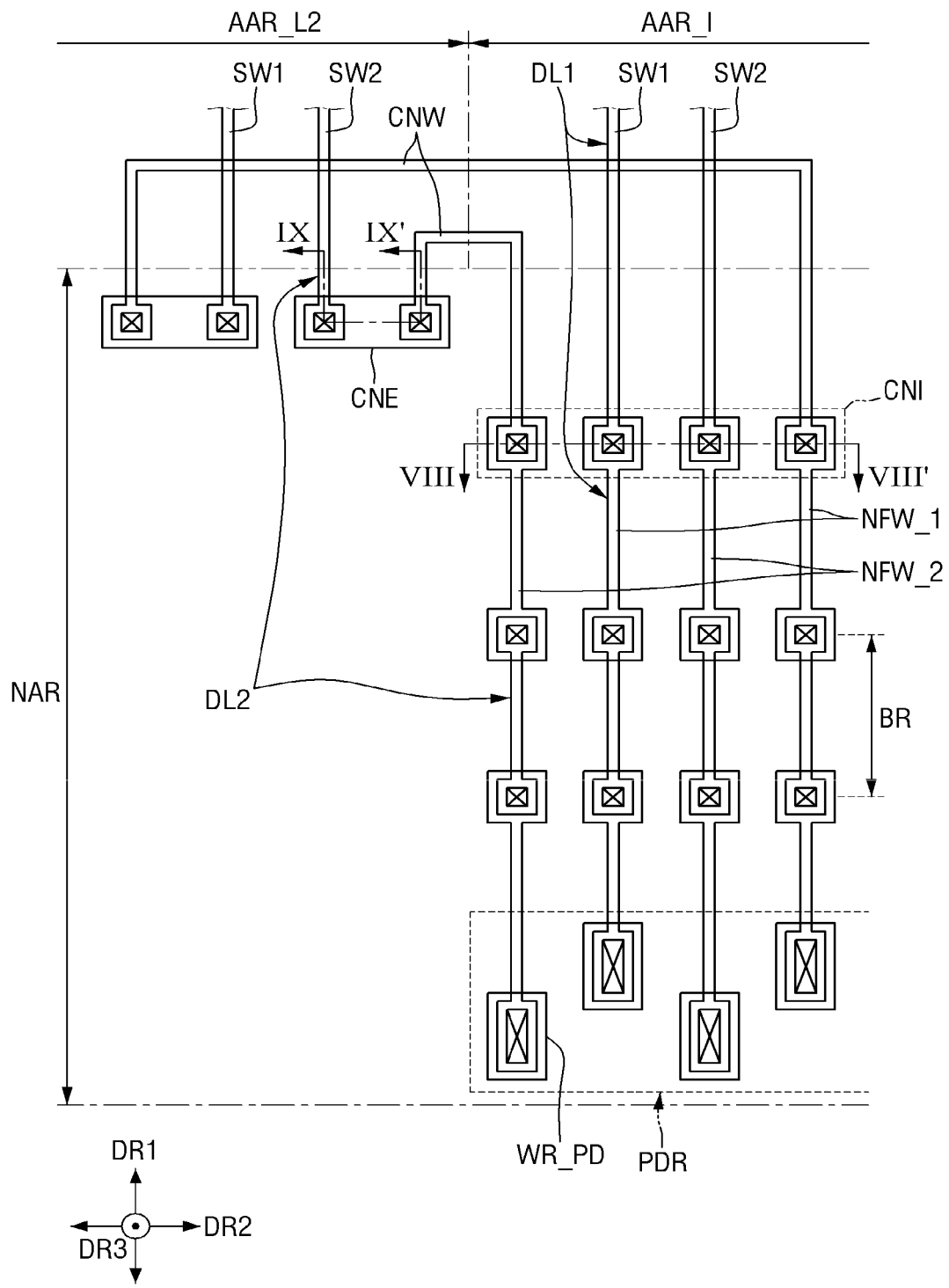
FIG. 7 is a layout view illustrating signal wirings constituting data lines according to an exemplary embodiment.
Figure 8:
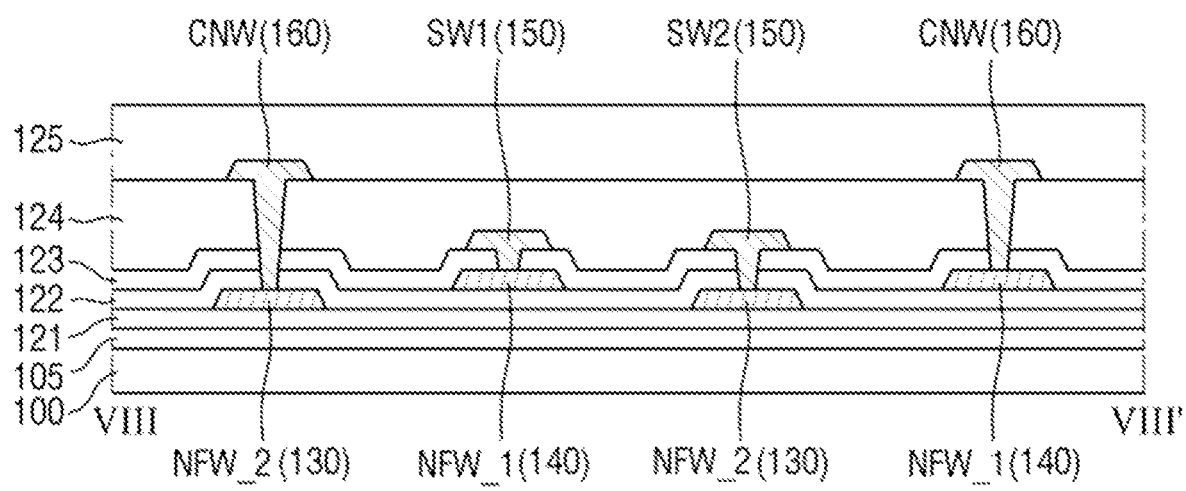
FIG. 8 is a cross-sectional view taken along sectional line VIII-VIII' of FIG. 7 according to an exemplary embodiment.
Figure 8:
Figure 9:
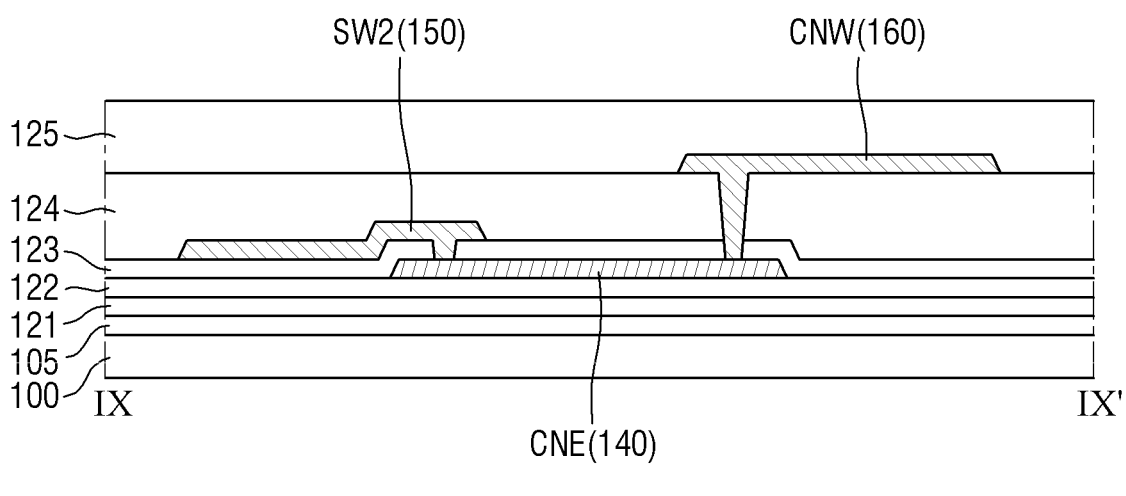
FIG. 9 is a cross-sectional view taken along sectional line IX-IX' of FIG. 7 according to an exemplary embodiment.

FIG. 7 is a layout view illustrating signal wirings constituting data lines according to an exemplary embodiment. FIG. 8 is a cross-sectional view taken along sectional line VIII-VIII' of FIG. 7 according to an exemplary embodiment. FIG. 9 is a cross-sectional view taken along sectional line IX-IX' of FIG. 7 according to an exemplary embodiment.

Referring to FIGS. 7 through 9, data lines DL include first data lines DL1 providing first data signals to pixels PX belonging to the first pixel columns PXC1 and second data lines DL2 providing second data signals to pixels PX belonging to the second pixel columns PXC2. The first data lines DL1 and the second data lines DL2 may be connected using a number of conductive layers from the pad portion PDR to the pixels PX of the active region AAR. The first data lines DL1 and the second data lines DL2 may be alternately arranged one-by-one over the entire active region AAR along the second direction DR2.

The first data lines DL1 and the second data lines DL2 may be divided into inner data lines and outer data lines. The inner data lines may be data lines for providing data signals to pixels PX located in the inner active region AAR_I, and the outer data lines may be data lines for providing data signals to pixels PX located in the outer active region AAR_L.

The data lines may include first and second non-active fan-out wirings NFW_1 and NFW_2 and first and second signal wirings SW1 and SW2. The first and second non-active fan-out wirings NFW_1 and NFW_2 may be disposed in the inner non-active region NAR, and the first and second signal wirings SW1 and SW2 may extend from the inner non-active region NAR to cross the active region AAR.

A first data line DL1 corresponding to an inner data line may include a first non-active fan-out wiring NFW_1 and a first signal wiring SW1. A second data line DL2 corresponding to an inner data line may include a second non-active fan-out wiring NFW_2 and a second signal wiring SW2.

The first and second non-active fan-out wirings NFW_1 and NFW_2 and the first and second signal wirings SW1 and SW2 of the inner data lines may be connected to each other in an inner wiring contact portion CNI located in the non-active region NAR adjacent to the inner active region AAR_I. The first and second non-active fan-out wirings NFW_1 and NFW_2 and the first and second signal wirings SW1 and SW2 of the inner data lines may directly contact each other in the inner wiring contact portion CNI.

The outer data lines may include connection wirings CNW (see, e.g., WR_CN in FIG. 6) in addition to first and second non-active fan-out wirings NFW_1 and NFW_2 and first and second signal wirings SW1 and SW2. The first and second non-active fan-out wirings NFW_1 and NFW_2 may be disposed in the inner non-active region NAR, and the first and second signal wirings SW1 and SW2 and the connection wirings CNW may extend from the inner non-active region NAR to cross the active region AAR.

A first data line DL1 corresponding to an outer data line may include a first non-active fan-out wiring NFW_1, a connection wiring CNW, and a first signal wiring SW1. A second data line DL2 corresponding to an outer data line may include a second non-active fan-out wiring NFW_2, a connection wiring CNW, and a second signal wiring SW2. The connection wirings CNW may be active fan-out wirings that pass through the active region AAR.

The connection wirings CNW and the first and second non-active fan-out wirings NFW_1 and NFW_2 of the outer data lines may be connected to each other in the inner wiring contact portion CNI located in the inner non-active region NAR. The first and second non-active fan-out wirings NFW_1 and NFW_2 and the connection wirings CNW may directly contact each other in the inner wiring contact portion CNI. The connection wirings CNW and the first and second signal wirings SW1 and SW2 may be connected to each other in outer wiring contact portions located in the non-active region NAR adjacent to the outer active region AAR_L. In the outer wiring contact portions, the connection wirings CNW and the first and second signal wirings SW1 and SW2 may be connected by contact electrodes CNE. However, exemplary embodiments are not limited to this case, and the connection wirings CNW and the first and second signal wirings SW1 and SW2 may also directly contact each other without the contact electrodes CNE. In this case, in each outer wiring contact portion, at least one of the contact wiring CNW and the first or second signal wiring SW1 or SW2 may further include a structure (e.g., a portion extending from the wiring in the second direction DR2) corresponding to the shape of the contact electrode CNE.

The inner data lines described above are data lines whose first and second non-active fan-out wirings NFW_1 and NFW_2 and first and second signal wirings SW1 and SW2 are directly connected to each other without the connection wirings CNW crossing the active region AAR. Thus, the inner data lines may be referred to as directly connected data lines, straight data lines, or direct data lines. On the other hand, the outer data lines are data lines whose first and second non-active fan-out wirings NFW_1 and NFW_2 and first and second signal wirings SW1 and SW2 are connected through the connection wirings CNW. Thus, the outer data lines may be referred to as indirectly connected data lines, circuitous data lines, or indirect data lines.

The first and second non-active fan-out wirings NFW_1 and NFW_2, the first and second signal wirings SW1 and SW2, and the connection wirings CNW may be made of conductive layers located on different layers. In an exemplary embodiment, the first and second non-active fan-out wirings NFW_1 and NFW_2 may be made of the first and second gate conductive layers 130 and 140, and the first and second signal wirings SW1 and SW2 and the connection wirings CNW may be made of different first and second data conductive layers 150 and 160.

For instance, the first non-active fan-out wirings NFW_1 belonging to the first data lines DL1 may be made of the second gate conductive layer 140 regardless of whether they are inner or outer data lines, and the second non-active fan-out wirings NFW_2 belonging to the second data lines DL2 may be made of the first gate conductive layer 130 regardless of whether they are inner or outer data lines. However, exemplary embodiments are not limited to this case, and the first non-active fan-out wirings NFW_1 may also be made of the first gate conductive layer 130, and the second non-active fan-out wirings NFW_2 may also be made of the second gate conductive layer 140.

The first signal wirings SW1 and the second signal wirings SW2 may all be made of the first data conductive layer 150 regardless of whether they are inner or outer data lines, and the connection wirings CNW may be made of the second data conductive layer 160, or vice versa.

The contact electrodes CNE may be made of a conductive layer disposed on a different layer from the connection wirings CNW and the first and second signal wirings SW1 and SW2. For example, the contact electrode CNE may be made of the second gate conductive layer 140 as illustrated in the drawings, but may also be made of the first gate conductive layer 130.

The first and second non-active fan-out wirings NFW_1 and NFW_2 may be connected to the wiring pads WP_PD and may extend to a different conductive layer midway to the wiring pads WR_PD. For example, each of the first and second non-active fan-out wirings NFW_1 and NFW_2 may pass through the bending region BR using the first data conductive layer 150 or the second data conductive layer 160 and then extend in the sub-region SR using the first gate conductive layer 130 or the second gate conductive layer 140. The wiring pads WP_PD may include the first and second gate conductive layers 130 and 140 and the first and second data conductive layers 150 and 160 connected to the first and second gate conductive layers 130 and 140 using contacts. When a conductive layer of a wiring is changed to a different conductive layer in a portion of the wiring, a contact hole for connecting the conductive layers may be formed in the portion.

Figure 10:
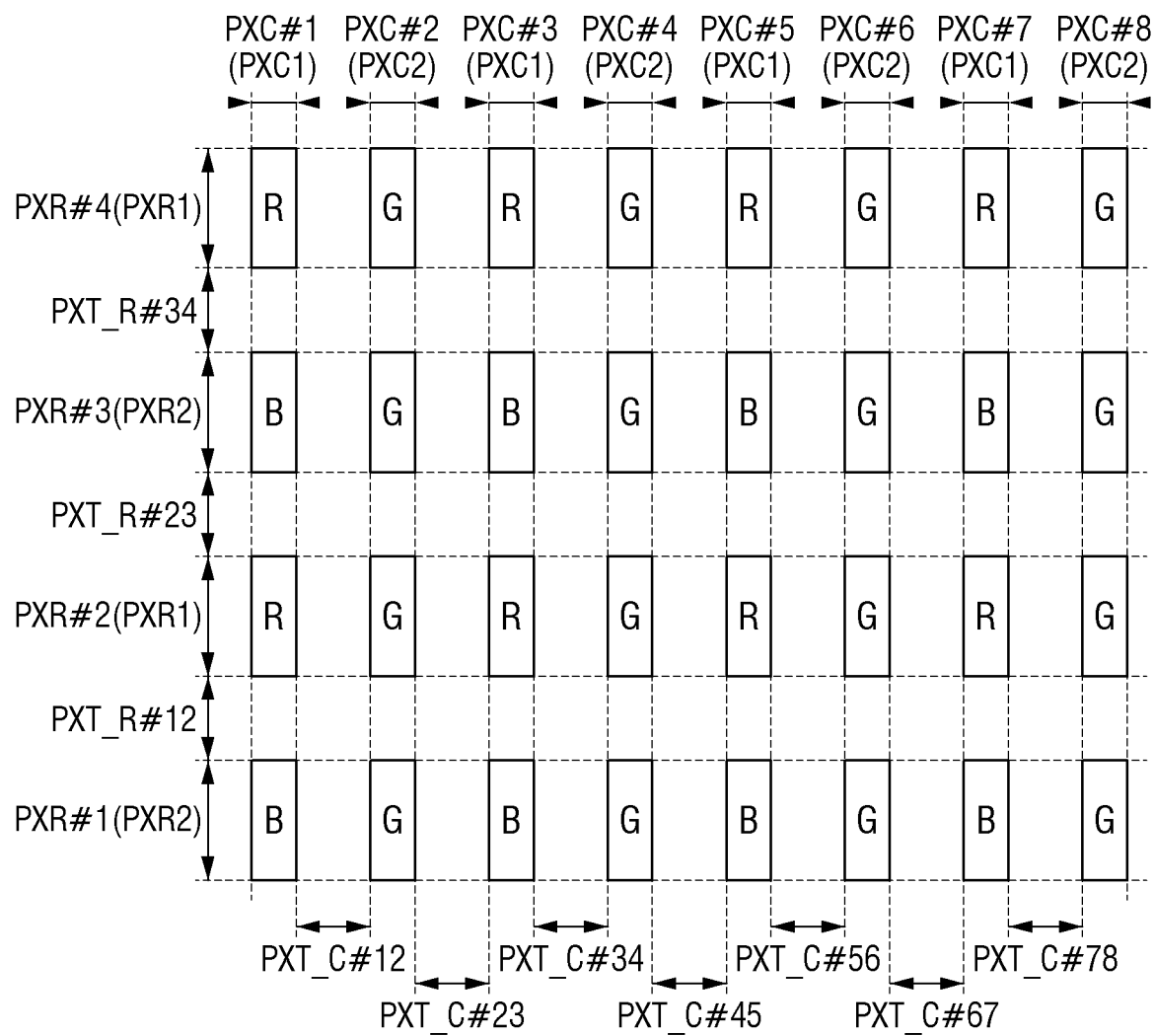
FIG. 10 is a partial layout view illustrating a pixel arrangement according to an exemplary embodiment.
Figure 11:
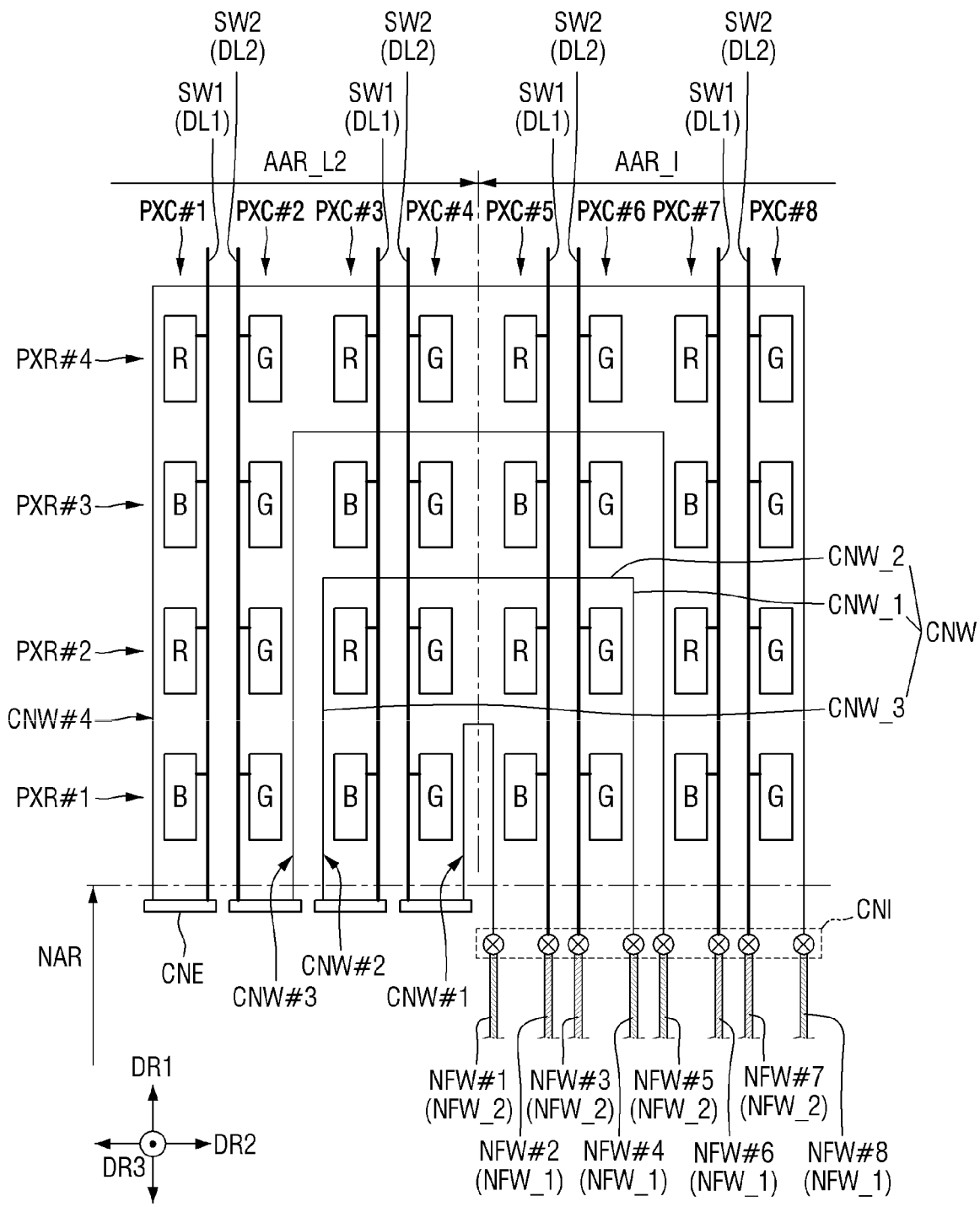
FIG. 11 is a partial layout view illustrating a data line arrangement together with the pixel arrangement of FIG. 10 according to an exemplary embodiment.

FIG. 10 is a partial layout view illustrating a pixel arrangement according to an exemplary embodiment. FIG. 11 is a partial layout view illustrating a data line arrangement together with the pixel arrangement of FIG. 10 according to an exemplary embodiment. In FIGS. 10 and 11, each pixel PX is illustrated as being rectangular for ease of description. FIGS. 10 and 11 conceptually illustrate a space covered by each pixel PX regardless of the shape of the light-emitting region EMA of the pixel PX. The same description may apply not only to a case where the light-emitting regions EMA of the pixels PX are actually rectangular, but also to cases where the light-emitting regions EMA of the pixels PX are staggered as illustrated in FIG. 3.

Referring to FIGS. 10 and 11, the first signal wirings SW1 and the second signal wirings SW2 may extend along boundaries of the pixels PX (or spaces between the pixels PX). Here, the boundary of each pixel PX is an edge portion of a space occupied by the pixel PX and may refer to a space outside the light-emitting region EMA of the pixel PX. In the following exemplary embodiments, a case where the first and second signal wirings SW1 and SW2 are disposed at the boundaries of the pixels PX will be described. However, the first and second signal wirings SW1 and SW2 may also be disposed to partially overlap the light-emitting regions EMA of the pixels PX. When the display device 1 is a top emission display device, even if the first and second signal wirings SW1 and SW2 overlap the light-emitting regions EMA across the pixels PX, they may not affect the luminance of emitted light.

The first signal wirings SW1 providing the first data signals to the first pixel columns PXC1 in the active region AAR may be disposed adjacent to first sides of the first pixel columns PXC1 in the second direction DR2, and the second signal wirings SW2 providing the second data signals to the second pixel columns PXC2 may be disposed adjacent to second sides of the second pixel columns PXC2 in the second direction DR2. A first signal wiring SW1 and a second signal wiring SW2 may form one pair, and the pair of the first and second signal wirings SW1 and SW2 may be disposed every other column of the pixels PX.

Inter-pixel column spaces PXT_C may include first inter-pixel column spaces PXT_C #12, PXT_C #34, PXT_C #56, and PXT_C #78 in which the first and second signal wirings SW1 and SW2 extend parallel to each other and second inter-pixel column spaces PXT_C #23, PXT_C #45, and PXT_C #67 in which the first and second signal wirings SW1 and SW2 are not disposed. The first inter-pixel column spaces PXT_C #12, PXT_C #34, PXT_C #56, and PXT_C #78 and the second inter-pixel column spaces PXT_C #23, PXT_C #45, and PXT_C #67 may be alternately arranged along the second direction DR2. For instance, the first and second signal wirings SW1 and SW2 are disposed parallel to each other in spaces (e.g., the first inter-pixel column spaces PXT_C #12, PXT_C #34, PXT_C #56, and PXT_C #78) between the first pixel columns PXC1 and the second pixel columns PXC2 disposed on the first sides of the first pixel columns PXC1 in the second direction DR2. The first and second signal wirings SW1 and SW2 are not disposed in spaces (e.g., the second inter-pixel column spaces PXT_C #23, PXT_C #45, and PXT_C #67) between the second pixel columns PXC2 and the first pixel columns PXC1 disposed on first sides of the second pixel columns PXC2 in the second direction DR2. A portion of each connection wiring CNW may be disposed in at least a portion of a second inter-pixel column space PXT_C #23, PXT_C #45, or PXT_C #67.

The connection wirings CNW may be disposed along the boundaries of the pixels PX in the active region AAR. The connection wirings CNW may include a bent structure. Each of the connection wirings CNW may include a first extension portion CNW_1 and a third extension portion CNW_3 extending in the first direction DR1 and a second extension portion CNW_2 extending in the second direction DR2.

The first extension portion CNW_1 may extend from the inner non-active region NAR toward the inner active region AAR_I (e.g., toward the second side in the first direction DR1). A first end of the first extension portion CNW_1 may be located in the inner non-active region NAR, and a second end of the first extension portion CNW_1 may be located in the inner active region AAR_I. The first end of the first extension portion CNW_1 may be connected to a non-active fan-out wiring NFW in the inner wiring contact portion CNI.

The second extension portion CNW_2 may be connected to the first extension portion CNW_1 and may extend toward the second side (or the first side) in the second direction DR2. The second extension portion CNW_2 may extend from the inner active region AAR_I toward the outer active region AAR_L. A first end of the second extension portion CNW_2 may be located in the inner active region AAR_I, and a second end of the second extension portion CNW_2 may be located in the outer active region AAR_L.

The first end of the second extension portion CNW_2 may be connected to the second end of the first extension portion CNW_1. A first bent portion of each connection wiring CNW may be located at the first end of the second extension portion CNW_2 and/or the second end of the first extension portion CNW_1. The whole of the second extension portion CNW_2 may be disposed in the active region AAR.

The third extension portion CNW_3 may be connected to the second extension portion CNW_2 and may extend from the outer active region AAR_L toward the outer non-active region NAR (e.g., the first side in the first direction DR1). A first end of the third extension portion CNW_3 may be located in the outer active region AAR_L, and a second end of the third extension portion CNW_3 may be located in the outer non-active region NAR. The first end of the third extension portion CNW_3 may be connected to the second end of the second extension portion CNW_2. A second bent portion of each connection wiring CNW may be disposed at the first end of the third extension portion CNW_3 and/or the second end of the second extension portion CNW_2. The second end of the third extension portion CNW_3 may be connected to a contact electrode CNE and/or a first or second signal wiring SW1 or SW2 connected to the contact electrode CNE in each outer wiring contact portion.

The first extension portions CNW_1 and the third extension portions CNW_3 of the connection wirings CNW may be disposed in the second inter-pixel column spaces PXT_C #23, PXT_C #45, and PXT_C #67 in the active region AAR. The second extension portions CNW_2 of the connection wirings CNW may be disposed in inter-pixel row spaces PXT_R of the active region AAR.

The first extension portions CNW_1 and the third extension portions CNW_3 of the connection wirings CNW passing through the inter-pixel column spaces PXT_C do not overlap the first and second signal wirings SW1 and SW2, but the second extension portions CNW_2 of the connection wirings CNW passing through the inter-pixel row spaces PXT_R may intersect the first and second signal wirings SW1 and SW2 and partially overlap the first and second signal wirings SW1 and SW2 at intersections.

The connection wirings CNW connected to different first and second signal wirings SW1 and SW2 are disposed at different positions and spaced apart from each other to avoid a short circuit between them. In an exemplary embodiment, the second extension portion CNW_2 of one connection wiring CNW may be disposed in one inter-pixel row space PXT_R. One or two first or third extension portions CNW_1 or CNW_3 may be disposed in one inter-pixel column space PXT_C. However, the number of the connection wirings CNW disposed in an inter-pixel space PXT (PXT_C or PXT_R) may vary according to a width of the inter-pixel space PXT.

The first and second signal wirings SW1 and SW2 of the outer data lines may be connected to non-active fan-out wirings NFW located farther away from them as they are farther from the inner active region AAR_I. That is, first and second signal wirings SW1 and SW2 adjacent to the inner active region AAR_I among the first and second signal wirings SW1 and SW2 of the outer data lines may be connected to non-active fan-out wirings NFW located relatively close to them. As the first and second signal wirings SW1 and SW2 of the outer data lines are farther from the first side in the second direction DR2, non-active fan-out wirings NFW closer to the second side in the second direction DR2 may be connected to the first and second signal wirings SW1 and SW2. The connection wiring CNW of an outer data line located on a relatively outer side may, in plan view, surround the connection wiring CNW of an outer data line located inside the above outer data line. Each connection wiring CNW may be disposed to have a shortest path in second inter-pixel column spaces PXT_C #23, PXT_C #45, and PXT_C #67 and an inter-pixel row space PXT_R. Therefore, the second inter-pixel column spaces PXT_C #23, PXT_C #45, and PXT_C #67 and the inter-pixel row space PXT_R may be sequentially utilized as the path of each connection wiring CNW without being missed midway.

The wirings of the data lines DL1 and DL2 will be described in more detail based on the pixel arrangement illustrated in FIG. 10. In FIG. 10, the pixels PX are arranged in a 4×8 structure in the second outer active region AAR_L2 and the inner active region AAR_I adjacent to the second outer active region AAR_L2. The wiring arrangement of the first outer active region AAR_L1 and the inner active region AAR_I adjacent to the first outer active region AAR_L1 may be symmetrical to the wiring arrangement of FIG. 11.

A leftmost column in the drawings is referred to as a first column, and the column number increases toward a right side. In addition, a lowermost row is referred to as a first row, and the row number increases toward an upper side. An inter-pixel space is referred to as, e.g., an "inter-½ pixel space" by providing numbers of adjacent pixels. The connection wirings CNW are numbered in order of shortest to longest path.

First, third, fifth, and seventh pixel columns PXC #1, PXC #3, PXC #5, and PXC #7 correspond to the first pixel columns PXC1, and second, fourth, sixth, and eighth pixel columns PXC #2, PXC #4, PXC #6, and PXC #8 correspond to the second pixel columns PXC2. In addition, the first through fourth pixel columns PXC #1 through PXC #4 are pixel columns PXC disposed in the outer active region AAR_L, and the fifth through eighth pixel columns PXC #5 through PXC #8 are pixel columns PXC disposed in the inner active region AAR_I.

Eight non-active fan-out wirings NFW are disposed in the inner non-active region NAR. First, third, fifth, and seventh non-active fan-out wirings NFW #1, NFW #3, NFW #5, and NFW #7 from a left side in the drawings are the second non-active fan-out wirings NFW_2 belonging to the second data lines DL2 connected to the second pixel columns PXC2. Second, fourth, sixth, and eighth non-active fan-out wirings NFW #2, NFW #4, NFW #6, and NFW #8 from the left side in the drawings are the first non-active fan-out wirings NFW_1 belonging to the first data lines DL1 connected to the first pixel columns PXC1.

The first non-active fan-out wiring NFW #1 is connected to a second signal wiring SW2, which is connected to the fourth pixel column PXC #4, by a first connection wiring CNW #1. The first extension portion CNW_1 of the first connection wiring CNW #1 is disposed in an inter-⅘ pixel column space PXT_C #45 in a first pixel row PXR #1. The second extension portion CNW_2 of the first connection wiring CNW #1 extends in an inter-½ pixel row space PXT_R #12 from the inter-⅘ pixel column space PXT_C #45. The third extension portion CNW_3 of the first connection wiring CNW #1 is disposed in the inter-⅘ pixel column space PXT_C #45 in the first pixel row PXR #1 and disposed on a second side of the first extension portion CNW_1 in the second direction DR2. The third extension portion CNW_3 of the first connection wiring CNW #1 is connected to the second signal wiring SW2 disposed in an inter-¾ pixel column space PXT_C #34 by a contact electrode CNE.

The second non-active fan-out wiring NFW #2 is disposed in an inter-⅚ pixel column space PXT_C #56 and connected to a first signal wiring SW1 connected to the fifth pixel column PXC #5.

The third non-active fan-out wiring NFW #3 is disposed in the inter-⅚ pixel column space PXT_C #56 and connected to a second signal wiring SW2 connected to the sixth pixel column PXC #6. The second signal wiring SW2 connected to the third non-active fan-out wiring NFW #3 in the inter-⅚ pixel column space PXT_C #56 is disposed on a first side of the first signal wiring SW1 connected to the second non-active fan-out wiring NFW #2 in the second direction DR2.

The fourth non-active fan-out wiring NFW #4 is connected to a first signal wiring SW1, which is connected to the third pixel column PXC #3, by a second connection wiring CNW #2. The first extension portion CNW_1 of the second connection wiring CNW #2 is disposed in an inter-6/7 pixel column space PXT_C #67 in the first pixel row PXR #1 and a second pixel row PXR #2. The second extension portion CNW_2 of the second connection wiring CNW #2 extends from the inter-6/7 pixel column space PXT_C #67 to an inter-⅔ pixel column space PXT_C #23 in an inter-⅔ pixel row space PXT_R #23. The third extension portion CNW_3 of the second connection wiring CNW #2 is disposed in the inter-2/3 pixel column space PXT_C #23 in the second and first pixel rows PXR #2 and PXR #1.

The fifth non-active fan-out wiring NFW #5 is connected to a second signal wiring SW2, which is connected to the second pixel column PXC #2, by a third connection wiring CNW #3. The first extension portion CNW_1 of the third connection wiring CNW #3 is disposed in the inter-6/7 pixel column space PXT_C #67 in the first pixel row PXR #1, the second pixel row PXR #2 and a third pixel row PXR #3. The first extension portion CNW_1 of the third connection wiring CNW #3 in the first and second pixel rows PXR #1 and PXR #2 is disposed on a first side of the first extension portion CNW_1 of the second connection wiring CNW #2 in the second direction DR2. The second extension portion CNW_2 of the third connection wiring CNW #3 extends from the inter-6/7 pixel column space PXT_C #67 to the inter-2/3 pixel column space PXT_C #23 in an inter-3/4 pixel row space PXT_R #34. The third extension portion CNW_3 of the third connection wiring CNW #3 is disposed in the inter-2/3 pixel column space PXT_C #23 in the third, second, and first pixel rows PXR #3, PXR #2, and PXR #1. The third extension portion CNW_3 of the third connection wiring CNW #3 in the first and second pixel rows PXR #1 and PXR #2 is disposed on a second side of the third extension portion CNW_3 of the second connection wiring CNW #2 in the second direction DR2.

The sixth non-active fan-out wiring NFW #6 is disposed in an inter-7/8 pixel column space PXT_C #78 and connected to a first signal wiring SW1 connected to the seventh pixel column PXC #7.

The seventh non-active fan-out wiring NFW #7 is disposed in the inter-7/8 pixel column space PXT_C #78 and connected to a second signal wiring SW2 connected to the eighth pixel column PXC #8. The second signal wiring SW2 connected to the seventh non-active fan-out wiring NFW #7 in the inter-7/8 pixel column space PXT_C #78 is disposed on a first side of the first signal wiring SW1 connected to the sixth non-active fan-out wiring NFW #6 in the second direction DR2.

The eighth non-active fan-out wiring NFW #8 is connected to a first signal wiring SW1, which is connected to the first pixel column PXC #1, by a fourth connection wiring CNW #4. The first extension portion CNW_1 of the fourth connection wiring CNW #4 is disposed in a space on a right side of the eighth pixel column PXC #8 (e.g., an inter-8/9 pixel column space PXT_C) in the first pixel row PXR #1, the second pixel row PXR #2, the third pixel row PXR #3, and a fourth pixel row PXR #4. The second extension portion CNW_2 of the fourth connection wiring CNW #4 extends from the space on the right side of the eighth pixel column PXC #8 (e.g., the inter-8/9 pixel column space) to a space on a left side of the first pixel column PXC #1 (e.g., an inter-0/1 pixel column space) in a space above the fourth pixel row PXR #4 (e.g., an inter-4/5 pixel row space). The third extension portion CNW_3 of the fourth connection wiring CNW #4 is disposed in the space on the left side of the first pixel column PXC #1 in the fourth, third, second, and first pixel rows PXR #4, PXR #3, PXR #2, and PXR #1.

As described above, two first and second signal wirings SW1 and SW2 are disposed in one first inter-pixel column space PXT_C #12, PXT_C #34, PXT_C #56, or PXT_C #78. For instance, one first signal wiring SW1 providing a first data signal to a first pixel column PXC1 and one second signal wiring SW2 providing a second data signal to a second pixel column PXC2 are disposed in one first inter-pixel column space PXT_C #12, PXT_C #34, PXT_C #56, or PXT_C #78. The first signal wiring SW1 is disposed closer to the second side in the second direction DR2 than the second signal wiring SW2 in one first inter-pixel column space PXT_C #12, PXT_C #34, PXT_C #56, or PXT_C #78.

In addition, the first and second signal wirings SW1 and SW2 are not disposed in the second inter-pixel column spaces PXT_C #23, PXT_C #45, and PXT_C #67, and a connection wiring CNW is disposed in a portion of each of the second inter-pixel column spaces PXT_C #23, PXT_C #45, and PXT_C #67. Each of the second inter-pixel column spaces PXT_C #23, PXT_C #45, and PXT_C #67 may be divided into a region where a connection wiring CNW is disposed and a region where the connection wiring CNW is not disposed. In the region where the connection wiring CNW is disposed, two first-direction extension portions of one or two connection wirings CNW are disposed in one second inter-pixel column space PXT_C #23, PXT_C #45, or PXT_C #67. The first extension portion CNW_1 and the third extension portion CNW_3 of one connection wiring CNW may be disposed as in the inter-4/5 pixel column space PXT_C #45, and the extension portions CNW_1 or CNW_3 of two different connection wirings CNW may be disposed as in the inter-6/7 pixel column space PXT_C #67.

Referring to the arrangement of the non-active fan-out wirings NFW of FIGS. 10 and 11, non-active fan-out wirings NFW belonging to the inner data lines and non-active fan-out wirings NFW belonging to the outer data lines coexist. For instance, after a non-active fan-out wiring NFW #1 of one outer data line is disposed, a pair of non-active fan-out wirings NFW #2/NFW #3, NFW #6/NFW #7, etc., of two inner data lines and a pair of non-active fan-out wirings NFW #4/NFW #5, NFW #8, etc., of two outer data lines are alternately arranged along the row direction of the array (e.g., along the first side in the second direction DR2). Although the non-active fan-out wirings NFW of the inner data lines and the non-active fan-out wirings NFW of the outer data lines coexist as described above, the first non-active fan-out wirings NFW_1 belonging to the first data lines DL1 and the second non-active fan-out wirings NFW_2 belonging to the second data lines DL2 are alternately and repeatedly arranged along the second direction DR2 based on data signals. Therefore, in the pad portion PDR connected to the non-active fan-out wirings NFW, wiring pads WR_PD receiving the first data signals and wiring pads WR_PD receiving the second data signals may be alternately and repeatedly arranged one-by-one along the direction of the row of the wiring pads WR_PD.

In a driver chip connected to the pad portion PDR, which output terminals (or bumps connected to the output terminals) may be used to output the first and second data signals is mapped in advance. A display device having the pixel arrangement of FIG. 3 and including only straight data lines without circuitous data lines generally uses a driver chip mapped such that a first data signal output terminal and a second data signal output terminal are sequentially and alternately arranged. In an exemplary embodiment, even if the display device 1 includes not only straight data lines, but also circuitous data lines using active fan-out wirings, since the wiring pads WR_PD receiving the first data signals and the wiring pads WR_PD receiving the second data signals are alternately arranged one-by-one along the direction of the row of the wiring pads WR_PD, the above general-purpose driver chip can be utilized without additional mapping for data signal components of the output terminals.

Furthermore, the inner data lines of the exemplary embodiments described in association with FIGS. 10 and 11 include all of the first signal wirings SW1 connected to the first non-active fan-out wirings NFW_1 and the second signal wirings SW2 connected to the second non-active fan-out wirings NFW_2. In the inner active region AAR_I, the first signal wirings SW1 connected to the first non-active fan-out wirings NFW_1 and the second signal wirings SW2 connected to the second non-active fan-out wirings NFW_2 are alternately arranged. In addition, the outer data lines include all of the first signal wirings SW1 connected to the first non-active fan-out wirings NFW_1 and the second signal wirings SW2 connected to the second non-active fan-out wirings NFW_2. In the outer active region AAR_L, the first signal wirings SW1 connected to the first non-active fan-out wirings NFW_1 by the connection wirings CNW and the second signal wirings SW2 connected to the second non-active fan-out wirings NFW_2 by the connection wirings CNW are alternately arranged one-by-one.

As described above, the first non-active fan-out wirings NFW_1 and the second non-active fan-out wirings NFW_2 are made of different conductive layers. For example, the first non-active fan-out wirings NFW_1 may be made of the first gate conductive layer 130, and the second non-active fan-out wirings NFW_2 may be made of the second gate conductive layer 140. Different conductive layers may show different process dispersions in a manufacturing process. The different process dispersions may lead to different resistances of the conductive layers and different data signals provided through data lines connected to the conductive layers. If pixels PX connected to data lines DL including a specific conductive layer form a block, there may be a difference in luminance between regions because the luminance of the block is affected by the process dispersion of the specific conductive layer. In an exemplary embodiment, the first signal wirings SW1 connected to the first non-active fan-out wirings NFW_1 made of the first gate conductive layer 130 and the second signal wirings SW2 connected to the second non-active fan-out wirings NFW_2 made of the second gate conductive layer 140 are all alternately arranged over the inner active region AAR_I and the outer active region AAR_L. For instance, data lines DL including a specific conductive layer are not put together in a block, but are evenly distributed over the entire region. Therefore, differences in luminance between regions due to the process dispersion of the specific conductive layer can be prevented (or mitigated). A difference in resistance value between the alternately arranged first and second data lines DL1 and DL2 due to process dispersions of specific conductive layers is irrelevant to the difference in luminance between regions, and this issue can be solved by compensating values of data signals provided through a driver chip.

Hereinafter, various other exemplary embodiments will be described.

Figure 12:
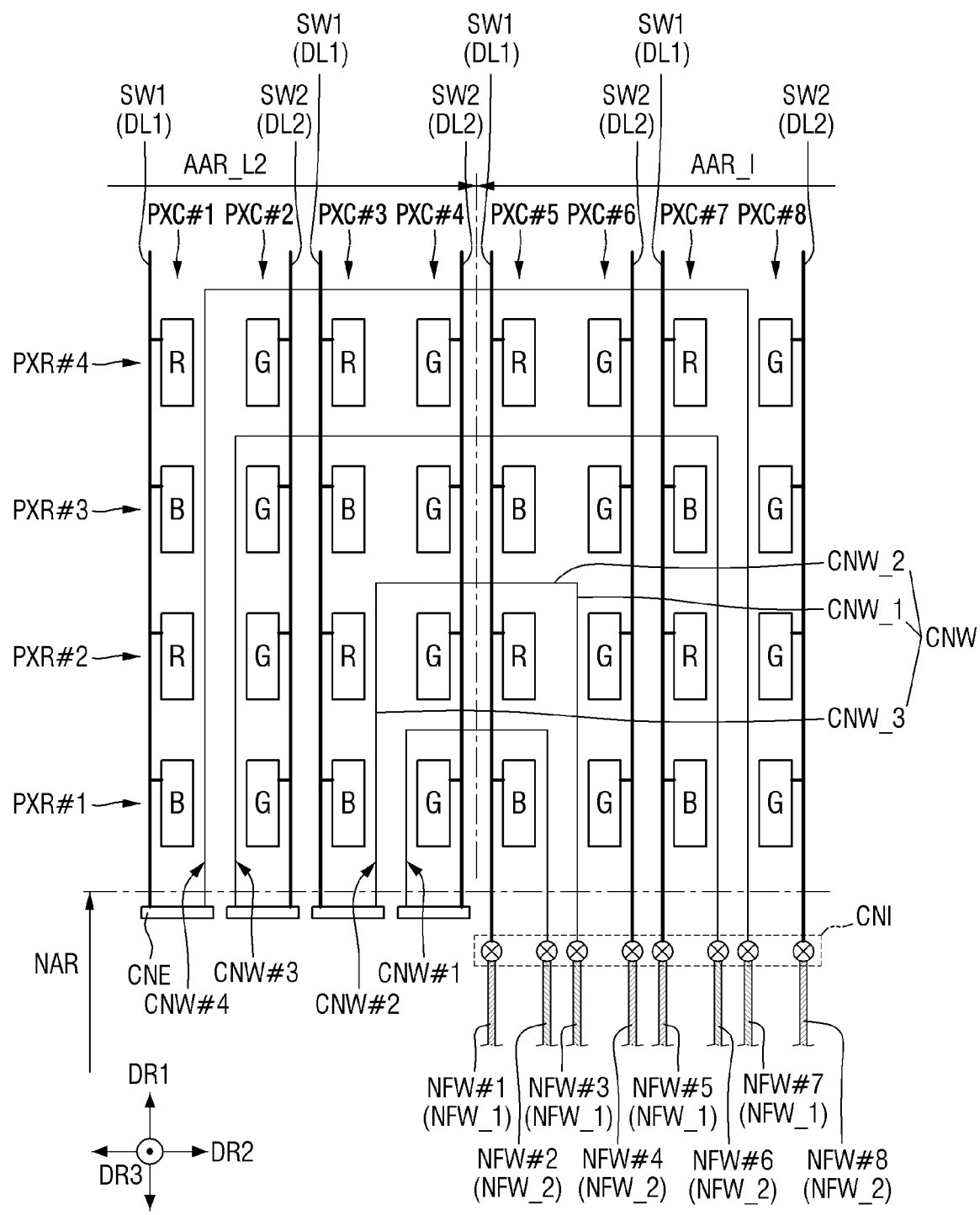
FIG. 12 is a partial layout view illustrating a pixel arrangement and a data line arrangement according to an exemplary embodiment.

FIG. 12 is a partial layout view illustrating pixel arrangement and data line arrangement according to an exemplary embodiment. In the following embodiments, elements of a pixel array will be named as described in FIG. 10.

Referring to FIG. 12, a display device is different from the display device 1 described in association with FIG. 11 in that first inter-pixel column spaces PXT_C #23, PXT_C #45, and PXT_C #67 in which first and second signal wirings SW1 and SW2 are disposed are located in spaces between second pixel columns PXC2 and first pixel columns PXC1 disposed on first sides of the second pixel columns PXC2 in the second direction DR2 and that second inter-pixel column spaces PXT_C #12, PXT_C #34, PXT_C #56, and PXT_C #78 in which connection wirings CNW are disposed are located in spaces between the first pixel columns PXC1 and the second pixel columns PXC2 disposed on first sides of the first pixel columns PXC1 in the second direction DR2.

In the 4×8 pixel arrangement of FIG. 12, first, third, fifth, and seventh pixel columns PXC #1, PXC #3, PXC #5, and PXC #7 correspond to the first pixel columns PXC1, and second, fourth, sixth and eighth pixel columns PXC #2, PXC #4, PXC #6, and PXC #8 correspond to the second pixel columns PXC2. In addition, the first through fourth pixel columns PXC #1 through PXC #4 are pixel columns PXC disposed in an outer active region AAR_L, and the fifth through eighth pixel columns PXC #5 through PXC #8 are pixel columns PXC disposed in an inner active region AAR_I.

Eight non-active fan-out wirings NFW are disposed in an inner non-active region NAR. The arrangement of the non-active fan-out wirings NFW is opposite to that described in association with FIG. 10. For instance, first, third, fifth, and seventh non-active fan-out wirings NFW #1, NFW #3, NFW #5, and NFW #7 from a left side in the drawing are first non-active fan-out wirings NFW_1 belonging to first data lines DL1 connected to the first pixel columns PXC1, and second, fourth, sixth, and eighth non-active fan-out wirings NFW #2, NFW #4, NFW #6, and NFW #8 are second non-active fan-out wirings NFW_2 belonging to second data lines DL2 connected to the second pixel columns PXC2.

The first non-active fan-out wiring NFW #1 is disposed in an inter-⅘ pixel column space PXT_C #45 and connected to a first signal wiring SW1 connected to the fifth pixel column PXC #5.

The second non-active fan-out wiring NFW #2 is connected to a second signal wiring SW2, which is connected to the fourth pixel column PXC #4, by a first connection wiring CNW #1. A first extension portion CNW_1 of the first connection wiring CNW #1 is disposed in the inter-⅚ pixel column space PXT_C #56 in a first pixel row PXR #1. A second extension portion CNW_2 of the first connection wiring CNW #1 extends from the inter-⅘ pixel column space PXT_C #45 to an inter-¾ pixel column space PXT_C #34 in an inter-½ pixel row space PXT_R12. A third extension portion CNW_3 of the first connection wiring CNW #1 is disposed in the inter-¾ pixel column space PXT_C #34 in the first pixel row PXR #1. The third extension portion CNW_3 of the first connection wiring CNW #1 is connected to the second signal wiring SW2 disposed in an inter-⅘ pixel column space PXT_C #45 by a contact electrode CNE.

The third non-active fan-out wiring NFW #3 is connected to a first signal wiring SW1, which is connected to the third pixel column PXC #3, by a second connection wiring CNW #2. A first extension portion CNW_1 of the second connection wiring CNW #2 is disposed in the inter-⅚ pixel column space PXT_C #56 in the first pixel row PXR #1 and a second pixel row PXR #2. The first extension portion CNW_1 of the second connection wiring CNW #2 in the first pixel row PXR #1 is disposed on a first side of the first extension portion CNW_1 of the first connection wiring CNW #1 in the second direction DR2. A second extension portion CNW_2 of the second connection wiring CNW #2 extends from the inter-⅚ pixel column space PXT_C #56 to the inter-¾ pixel column space PXT_C #34 in an inter-⅔ pixel row space PXT_R #23. A third extension portion CNW_3 of the second connection wiring CNW #2 is disposed in the inter-¾ pixel column space PXT_C #34 in the second and first pixel rows PXR #2 and PXR #1. The third extension portion CNW_3 of the second connection wiring CNW #2 is connected to the first signal wiring SW1 disposed in an inter-⅔ pixel column space PXT_C #23 by a contact electrode CNE. The third extension portion CNW_3 of the second connection wiring CNW #2 in the first pixel row PXR #1 is disposed on a second side of the third extension portion CNW_3 of the first connection wiring CNW #1 in the second direction DR2.

The fourth non-active fan-out wiring NFW #4 is disposed in an inter-6/7 pixel column space PXT_C #67 and connected to a second signal wiring SW2 connected to the sixth pixel column PXC #6.

The fifth non-active fan-out wiring NFW #5 is disposed in the inter-6/7 pixel column space PXT_C #67 and connected to a first signal wiring SW1 connected to the seventh pixel column PXC #7. The first signal wiring SW1 connected to the seventh pixel column PXC #7 in the inter-6/7 pixel column space PXT_C #67 is disposed on a first side of the second signal wiring SW2, which is connected to the sixth pixel column PXC #6, in the second direction DR2.

The sixth non-active fan-out wiring NFW #6 is connected to a second signal wiring SW2, which is connected to the second pixel column PXC #2, by a third connection wiring CNW #3. A first extension portion CNW_1 of the third connection wiring CNW #3 is disposed in an inter-⅞ pixel column space PXT_C #78 in the first pixel row PXR #1, the second pixel row PXR #2, and a third pixel row PXR #3. A second extension portion CNW_2 of the third connection wiring CNW #3 extends from the inter-⅞ pixel column space PXT_C #78 to an inter-½ pixel column space PXT_C #12 in an inter-¾ pixel row space PXT_R #34. The third extension portion CNW_3 of the third connection wiring CNW #3 is disposed in the inter-½ pixel column space PXT_C #12 in the third, second, and first pixel rows PXR #3, PXR #2, and PXR #1. The third extension portion CNW_3 of the third connection wiring CNW #3 is connected to the second signal wiring SW2 disposed in the inter-⅔ pixel column space PXT_C #23 by a contact electrode CNE.

The seventh non-active fan-out wiring NFW #7 is connected to a first signal wiring SW1, which is connected to the first pixel column PXC #1, by a fourth connection wiring CNW #4. A first extension portion CNW_1 of the fourth connection wiring CNW #4 is disposed in the inter-⅞ pixel column space PXT_C #78 in the first pixel row PXR #1, the second pixel row PXR #2, the third pixel row PXR #3, and a fourth pixel row PXR #4. The first extension portion CNW_1 of the fourth connection wiring CNW #4 in the first, second, and third pixel rows PXR #1, PXR #2, and PXR #3 is disposed on a first side of the first extension portion CNW_1 of the third connection wiring CNW #3 in the second direction DR2. A second extension portion CNW_2 of the fourth connection wiring CNW #4 extends from the inter-⅞ pixel column space PXT_C #78 to the inter-½ pixel column space PXT_C #12 in a space above the fourth pixel row PXR #4 (e.g., an inter-⅘ pixel row space). A third extension portion CNW_3 of the fourth connection wiring CNW #4 is disposed in the inter-½ pixel column space PXT_C #12 in the fourth, third, second, and first pixel rows PXR #4, PXR #3, PXR #2, and PXR #1. The third extension portion CNW_3 of the fourth connection wiring CNW #4 is connected to the first signal wiring SW1 disposed in a space on a left side of the first pixel column PXC #1 (e.g., an inter-0/1 pixel column space) by a contact electrode CNE. In the third, second, and first pixel rows PXR #3, PXR #2, and PXR #1, the third extension portion CNW_3 of the fourth connection wiring CNW #4 is disposed on a second side of the third extension portion CNW_3 of the third connection wiring CNW #3 in the second direction DR2.

The eighth non-active fan-out wiring NFW #8 is disposed in a space on a right side of the eighth pixel column PXC #8 (e.g., an inter-8/9 pixel column space) and connected to a second signal wiring SW2 connected to the eighth pixel column PXC #8.

The exemplary embodiments described in association with FIG. 12 are different from the exemplary embodiments described in association with FIG. 11 in the arrangement of the first inter-pixel column spaces PXT_C #23, PXT_C #45, and PXT_C #67 and the second inter-pixel column spaces PXT_C #12, PXT_C #34, PXT_C #56, and PXT_C #78 and the arrangement of the connection wirings CNW. However, the first non-active fan-out wirings NFW_1 belonging to the first data lines DL1 and the second non-active fan-out wirings NFW_2 belonging to the second data lines DL2 are alternately and repeatedly arranged one-by-one along the row direction (e.g., the second direction DR2). Therefore, although the exemplary embodiments described in association with FIG. 12 includes not only straight data lines, but also circuitous data lines using active fan-out wirings, since wiring pads WR_PD receiving first data signals and wiring pads WR_PD receiving second data signals are alternately arranged along a direction of a row of the wiring pads WR_PD, a general-purpose driver chip can be utilized without additional mapping for data signal components of output terminals.

Furthermore, the first signal wirings SW1 connected to the first non-active fan-out wirings NFW_1 made of a first gate conductive layer 130 and the second signal wirings SW2 connected to the second non-active fan-out wirings NFW_2 made of a second gate conductive layer 140 are all alternately arranged one-by-one over the inner active region AAR_I and the outer active region AAR_L. Therefore, a difference in luminance between regions due to process dispersion of a specific conductive layer can be prevented or mitigated.

Figure 13:
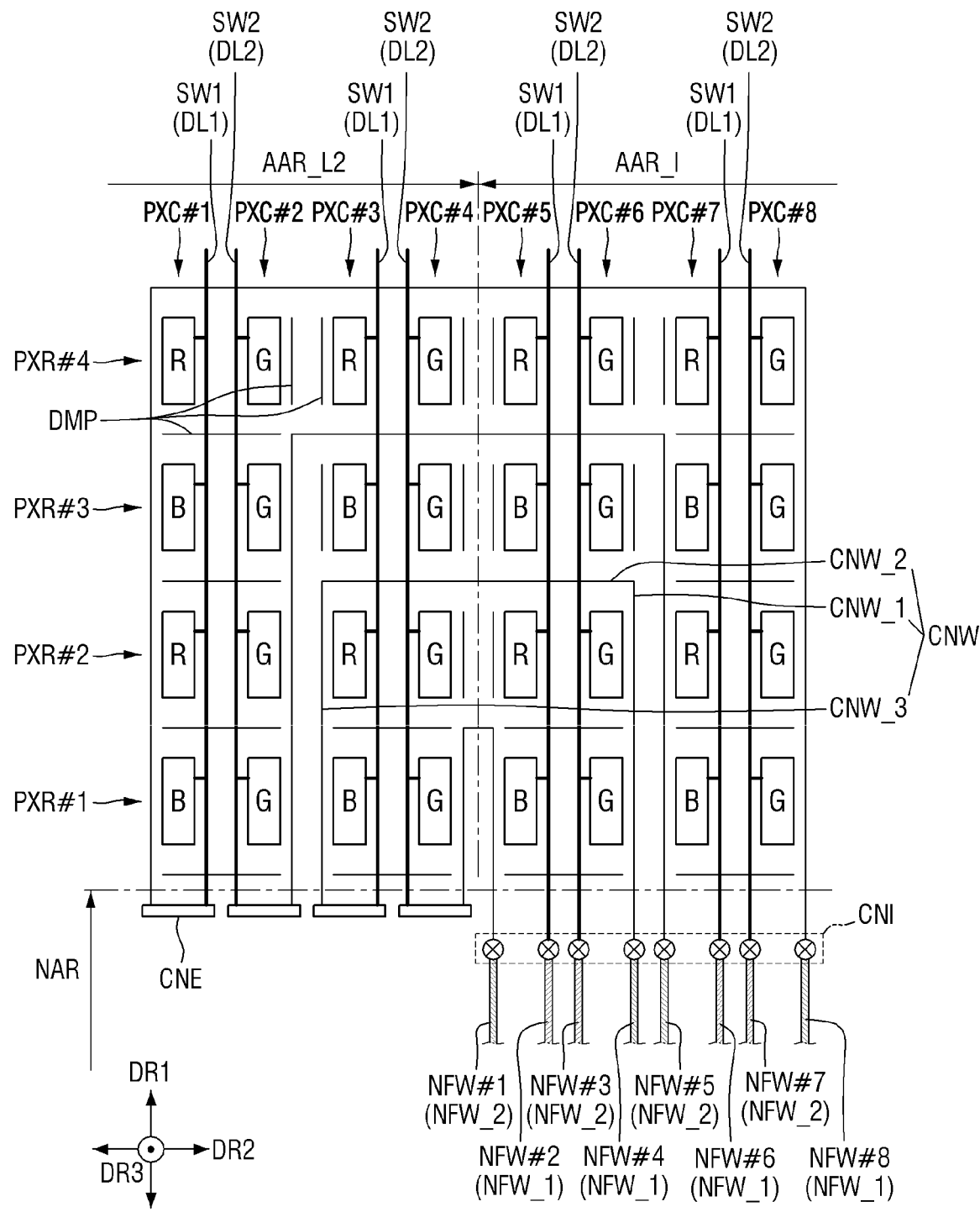
FIG. 13 is a partial layout view illustrating a pixel arrangement and a data line arrangement according to an exemplary embodiment.

FIG. 13 is a partial layout view illustrating a pixel arrangement and a data line arrangement according to an exemplary embodiment.

Referring to FIG. 13, a display device is different from the display device 1 described in association with FIG. 11 in that dummy wiring patterns DMP are disposed on the same layer as connection wirings CNW.

For instance, as described in association with FIG. 11, first and second signal wirings SW1 and SW2 or the connection wirings CNW are disposed in some inter-pixel spaces PXT, but are not disposed in other inter-pixel spaces PXT. When the inter-pixel spaces PXT are divided into spaces where wirings are disposed and spaces where no wirings are disposed as described above, a visual defect (or difference) in which the spaces are seen from the outside due to a difference in reflectance may occur. If the dummy wiring patterns DMP are disposed in the spaces where the first and second signal wirings SW1 and SW2 or the connection wirings CNW are not disposed among the inter-pixel spaces PXT, a difference between the spaces may be reduced, thereby preventing (or mitigating) the spaces from being seen from the outside. That is, visibility (or display quality) can be improved.

The dummy wiring patterns DMP may be made of the same conductive layer as the connection wirings CNW. When the connection wirings CNW are made of a second data conductive layer 160, the dummy wiring patterns DMP are also made of the second data conductive layer 160. The dummy wiring patterns DMP may be formed together with (at the same time as) the connection wirings CNW.

The dummy wiring patterns DMP may be separated from the connection wirings CNW. That is, the dummy wiring patterns DMP are formed on the same layer as the connection wirings CNW, but may be spaced apart from the connection wirings CNW in a plan view. The dummy wiring patterns DMP may be floating wiring patterns to which electrical signals are not directly transmitted.

The dummy wiring patterns DMP may have substantially the same shape and arrangement as the connection wirings CNW in the inter-pixel spaces PXT. However, since the dummy wiring patterns DMP disposed in the inter-pixel spaces PXT are spaced apart from adjacent connection wirings CNW, they may have a shorter length than the adjacent connection wirings CNW.

In an exemplary embodiment, one connection wiring CNW may pass through an inter-pixel row space PXT_R and extend in the second direction DR2. Similarly, one dummy wiring pattern DMP may also pass through the inter-pixel row space PXT_R and extend in the second direction DR2.

The connection wirings CNW passing through an inter-pixel column space PXT_C may include one or two portions extending in the first direction DR1. When two portions extend, they may belong to different connection wirings CNW or one connection wiring CNW. In either case, the connection wirings CNW passing through an inter-pixel column space PXT_C may generally include two portions extending in the first direction DR1. Two dummy wiring patterns DMP may be disposed in an inter-pixel column space PXT_C where no connection wiring CNW is disposed, and one dummy wiring pattern DMP may be disposed in the inter-pixel column space PXT_C where one extension portion of a connection wiring CNW is disposed.

Figure 14:
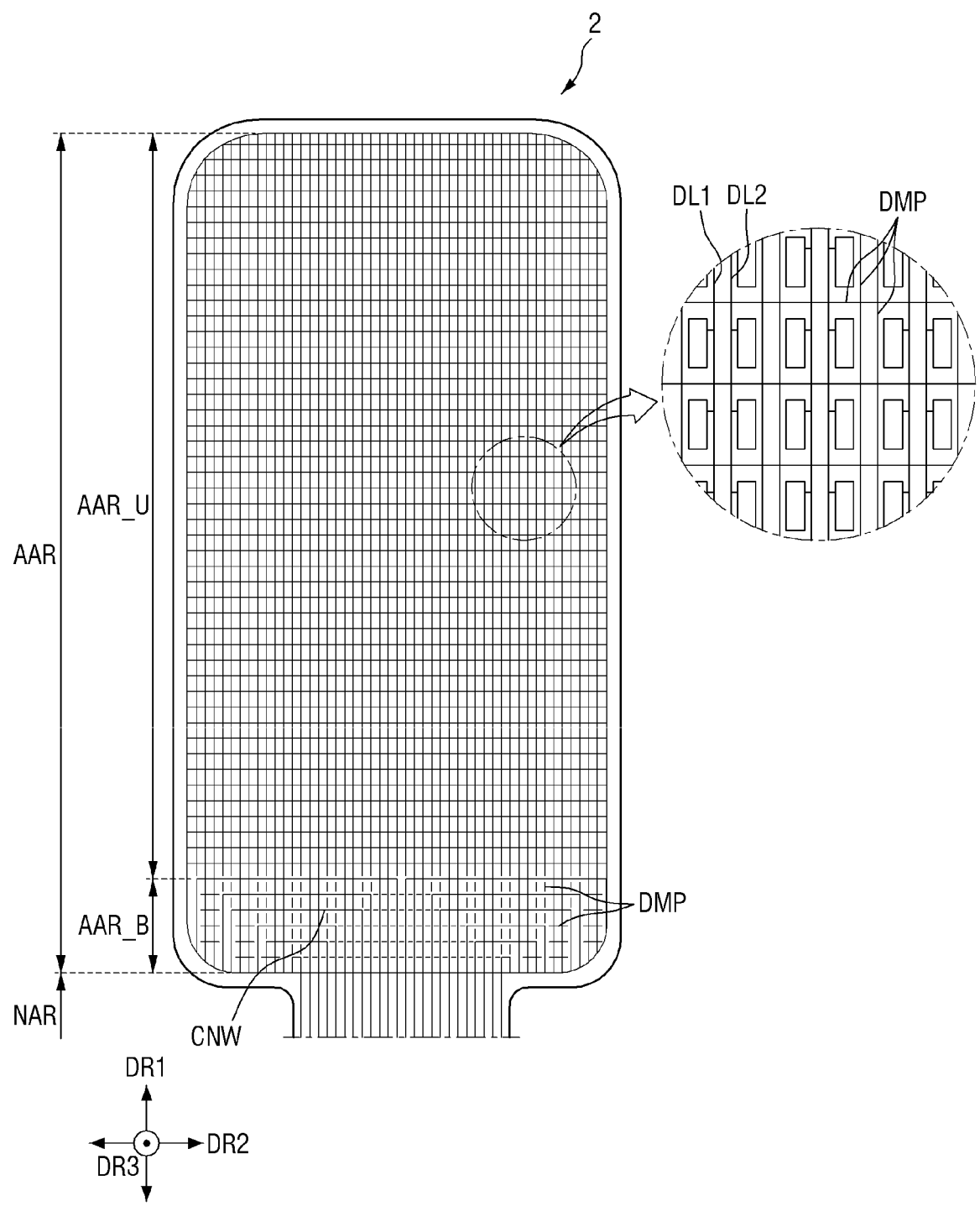
FIG. 14 is a schematic layout view illustrating a wiring arrangement of a display device according to an exemplary embodiment.

FIG. 14 is a schematic layout view illustrating a wiring arrangement of a display device 2 according to an exemplary embodiment. FIG. 14 shows that, to improve visibility, the display device 2 may include dummy wiring patterns DMP not only in regions around connection wirings CNW, but also in regions spaced apart from the connection wirings CNW.

Referring to FIG. 14, the connection wirings CNW may be disposed mostly in a lower region AAR_B of an active region AAR, which is adjacent to a non-active region NAR in plan view and may not be disposed in an upper region AAR_U. In this case, the lower region AAR_B and the upper region AAR_U of the active region AAR are likely to be distinguished from each other with the naked eye depending on the presence or absence of the connection wirings CNW. Even in the lower region AAR_B of the active region AAR, inter-pixel spaces PXT in which the connection wirings CNW are disposed may be distinguished from inter-pixel spaces PXT in which the connection wirings CNW are not disposed. In the lower region AAR_B of the active region AAR, the dummy wiring patterns DMP may be disposed in the inter-pixel spaces PXT in which the connection wirings CNW are not disposed, as illustrated in FIG. 13. If the dummy wiring patterns DMP are disposed in the lower region AAR_B of the active region AAR as described above, a visual defect (or difference) due to the presence or absence of the connection wirings CNW in the lower region AAR_B can be prevented or mitigated. However, it is still difficult to prevent the lower region AAR_B from being distinguished from the upper region AAR_U of the active region AAR where the connection wirings CNW are not disposed at all.

To prevent or mitigate the lower region AAR_B and the upper region AAR_U of the active region AAR from being visually distinguished and seen due to the presence or absence of the connection wirings CNW, the dummy wiring patterns DMP may also be disposed in the upper region AAR_U of the active region AAR. The dummy wiring patterns DMP may be disposed in all inter-pixel spaces PXT in which the connection wirings CNW are not disposed. Two dummy wiring patterns DMP extending in the first direction DR1 may be disposed in an inter-pixel column space PXT_C, and one dummy wiring pattern DMP extending in the second direction DR2 may be disposed in an inter-pixel row space PXT_R. In the upper region AAR_U of the active region AAR, a dummy wiring pattern DMP may pass a plurality of pixels PX. For example, a dummy wiring pattern DMP disposed in an inter-pixel row space PXT_R may extend from an outermost pixel PX on a first side in the second direction DR2 to an outermost pixel PX on a second side in the second direction DR2. In addition, a dummy wiring pattern DMP disposed in an inter-pixel column space PXT_C may extend from an outermost pixel PX on a second side in the first direction DR1 to a pixel PX adjacent to the lower region AAR_B of the active region AAR where the connection wirings CNW are disposed.

Figure 15:
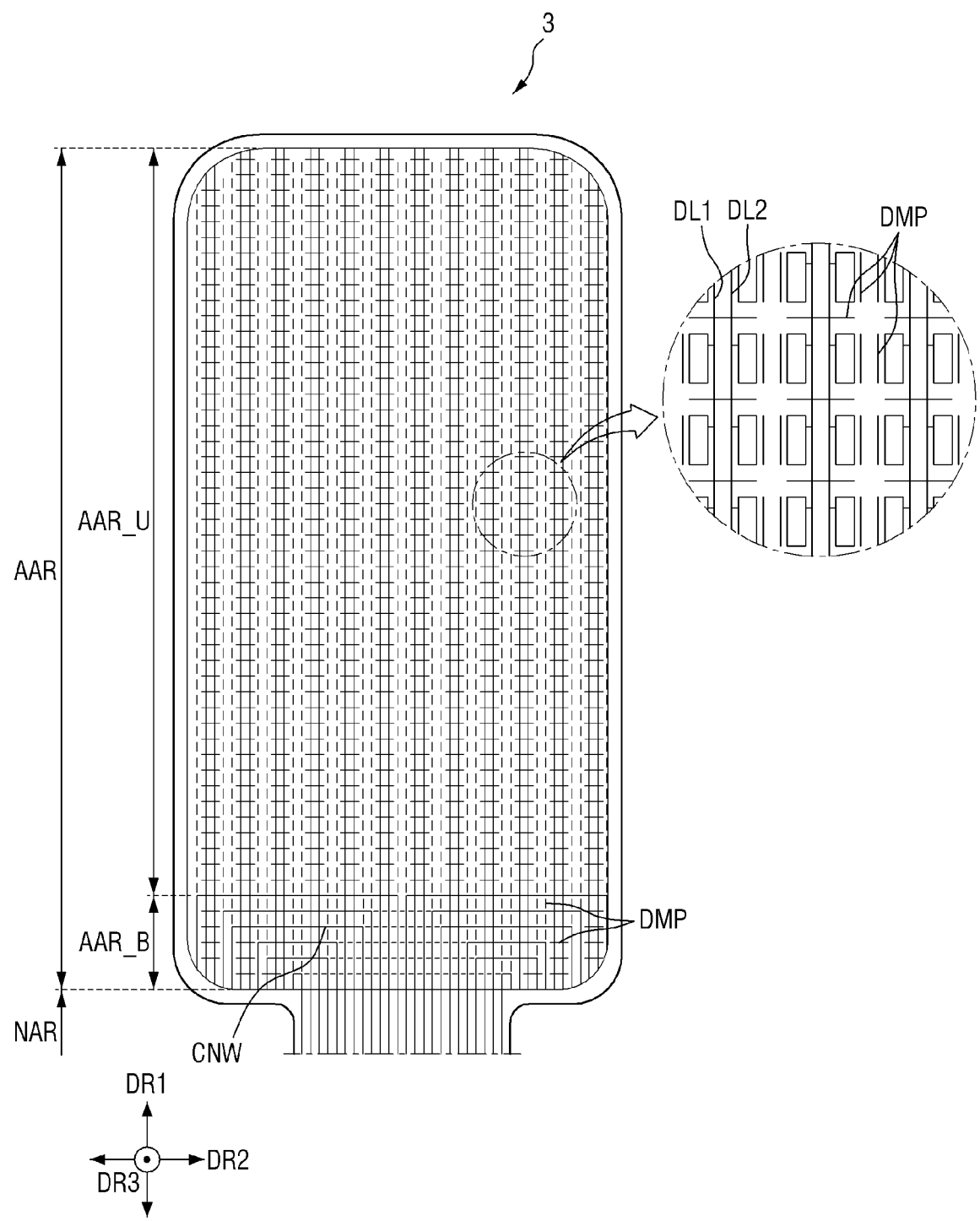
FIG. 15 is a schematic layout view illustrating a pixel arrangement and a data line arrangement according to an exemplary embodiment.

FIG. 15 is a schematic layout view illustrating pixel arrangement and a data line arrangement according to an exemplary embodiment.

Referring to FIG. 15, a display device 3 is different from the display device 2 described in association with FIG. 14 in that each dummy wiring pattern DMP disposed in an upper region AAR_U of an active region AAR is divided into a plurality of segments along the first direction DR1 or the second direction DR2 and is generally disposed in the shape of stitches, e.g., line segments. A dummy wiring pattern DMP disposed in an inter-pixel column space PXT_C in a lower region AAR_B of the active region AAR extends to a length generally corresponding to one pixel row PXR. In addition, a dummy wiring pattern DMP disposed in an inter-pixel row space PXT_R in the lower region AAR_B of the active region AAR extends to a length generally corresponding to two pixel columns PXC. As seen in FIG. 15, the dummy wiring patterns DMP disposed in the upper region AAR_U of the active region AAR also extend to lengths similar to those of the dummy wiring patterns DMP disposed in the lower region AAR_B. That is, a dummy wiring pattern DMP disposed in an inter-pixel column space PXT_C in the upper region AAR_U of the active region AAR may extend to a length generally corresponding to one pixel row PXR, and a dummy wiring pattern DMP disposed in an inter-pixel row space PXT_R may extend to a length generally corresponding to two pixel columns PXC.

If the dummy wiring patterns DMP disposed in the upper region AAR_U of the active region AAR where connection wirings CNW are not disposed at all extend to the same lengths and are arranged in the same manner as the dummy wiring patterns DMP disposed in the lower region AAR_B as described above, a visual defect in which the upper region AAR_U and the lower region AAR_B of the active region AAR are distinguished with the naked eye can be further prevented or mitigated.

Figure 16:
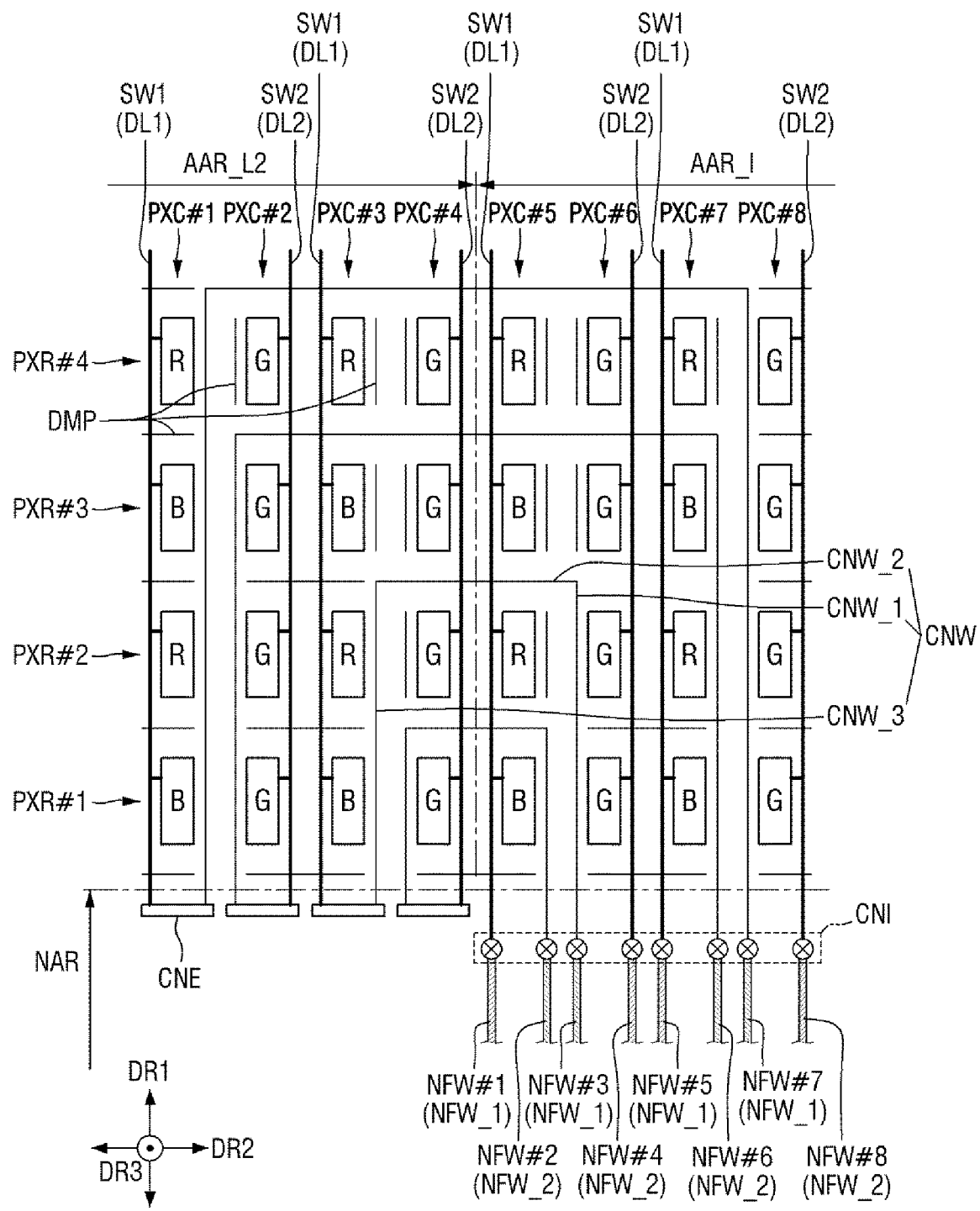
FIG. 16 is a partial layout view illustrating a pixel arrangement and a data line arrangement according to an exemplary embodiment.

FIG. 16 is a partial layout view illustrating a pixel arrangement and a data line arrangement according to an exemplary embodiment. FIG. 16 shows that the dummy wiring patterns DMP of FIG. 13 are applicable to the exemplary embodiments described in association with FIG. 12.

Referring to FIG. 16, the display device is the same as described in association with FIG. 13 in the arrangement of pixels PX, connection wirings CNW, and data lines DL. In the exemplary embodiments described in association with FIG. 13, first and second signal wirings SW1 and SW2 or connection wirings CNW are disposed in some inter-pixel spaces PXT, but are not disposed in other inter-pixel spaces PXT. Thus, the dummy wiring patterns DMP may be disposed in the inter-pixel spaces PXT in which the first and second signal wirings SW1 and SW2 and the connection wirings CNW are not disposed. This may reduce a difference between spaces, thereby preventing (or mitigating) the spaces from being seen from the outside. The number and arrangement of the dummy wiring patterns DMP are the same as those described in association with FIG. 13, and, thus, a redundant description thereof is omitted.

Figure 17:
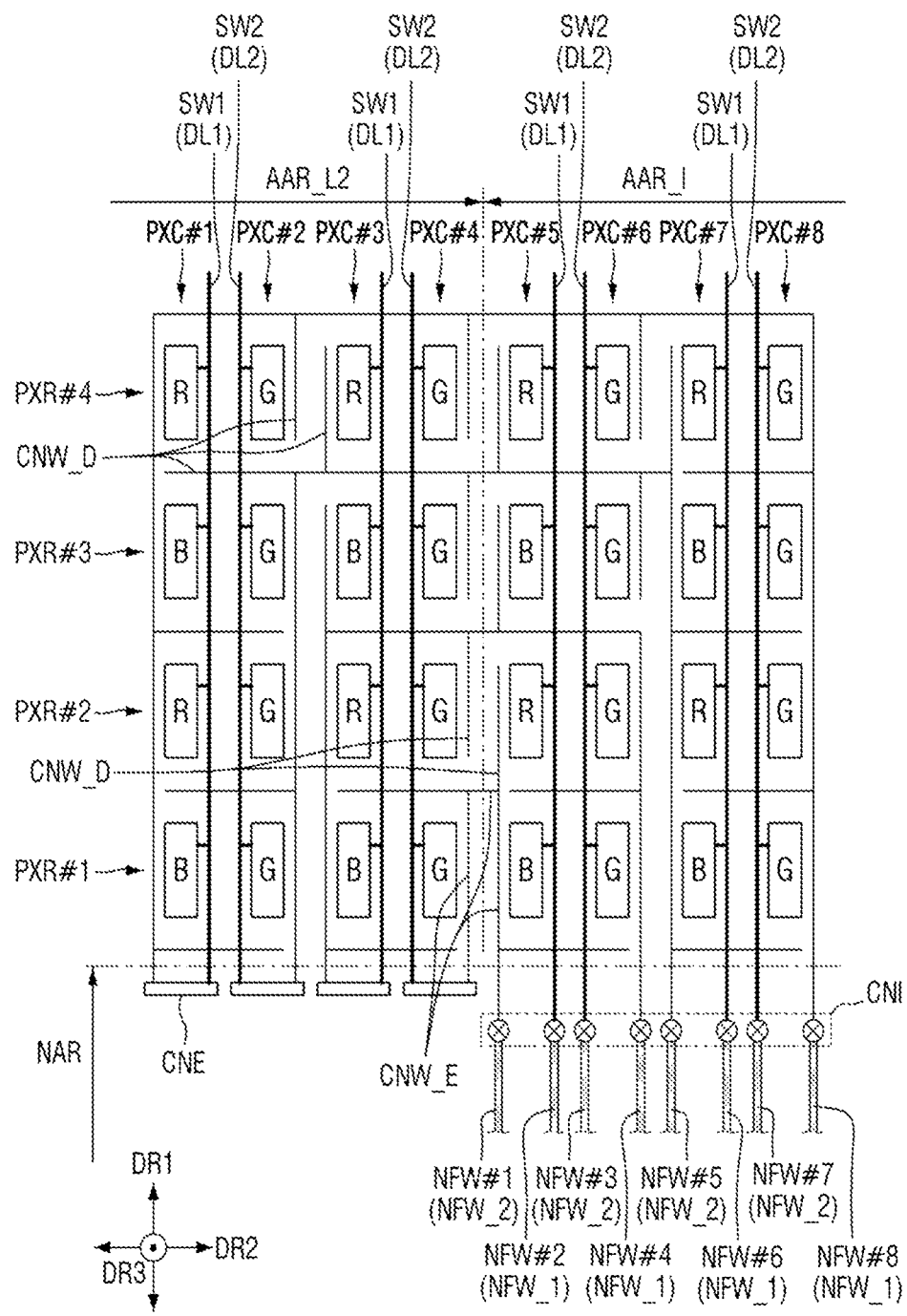
FIG. 17 is a partial layout view illustrating a pixel arrangement and a data line arrangement according to an exemplary embodiment.

FIG. 17 is a partial layout view illustrating a pixel arrangement and a data line arrangement according to an exemplary embodiment.

Referring to FIG. 17, a display device is different from the exemplary embodiments described in association with FIG. 13 in that the dummy wiring patterns DMP are omitted, and each connection wiring CNW includes dummy portions CNW_D instead.

For instance, each connection wiring CNW may include an effective wiring portion CNW_E, which extends from a non-active fan-out wiring NFW by a shortest distance so as to be connected to a first or second signal wiring SW1 or SW2 and the dummy portions CNW_D, which branch from the effective wiring portion CNW_E and extend to inter-pixel spaces PXT. The effective wiring portion CNW_E of each connection wiring CNW may have substantially the same shape as each connection wiring CNW of FIG. 13. The dummy portions CNW_D of each connection wiring CNW may have substantially the same shape as the dummy wiring patterns DMP of FIG. 13, except that they are connected to the adjacent effective wiring portion CNW_E.

Some of the dummy portions CNW_D of each connection wiring CNW may be disposed in inter-pixel column spaces PXT_C and may extend in the first direction DR1. The other dummy portions CNW_D of each connection wiring CNW may be disposed in inter-pixel row spaces PXT_R and may extend in the second direction DR2. Each dummy portion CNW_D of one connection wiring CNW may extend to near an adjacent connection wiring CNW, but may be spaced apart from the adjacent connection wiring CNW without contacting the adjacent connection wiring CNW.

Each dummy portion CNW_D of each connection wiring CNW is shaped like a dummy wiring pattern DMP of FIG. 13 having an end connected to an adjacent connection wiring CNW. As seen in FIG. 17, each dummy portion CNW_D of each connection wiring CNW may also be modified to be shaped like a dummy wiring pattern DMP having the other end connected to an adjacent connection wiring CNW.

In an exemplary embodiment, two dummy portions CNW_D disposed in one inter-pixel column space PXT_C may belong to different connection wirings CNW. That is, two dummy portions CNW_D disposed in one inter-pixel column space PXT_C may be connected to respective portions of different connection wirings CNW. Here, the respective portions of the different connection wirings CNW to which the two dummy portions CNW_D are connected may be the effective wiring portions CNW_E. However, if all of dummy portions CNW_D branch off or extend over a plurality of inter-pixel spaces PXT, an end of one dummy portion CNW_D may be connected to the other dummy portion CNW_D.

As seen in FIG. 17, a dummy portion CNW_D disposed on a first side of a specific inter-pixel column space PXT_C may belong to a connection wiring CNW located on a first side in the first direction DR1, and a dummy portion CNW_D disposed on a second side of the specific inter-pixel column space PXT_C may belong to a connection wiring CNW located on a second side in the first direction DR1. This connection structure between a dummy portion CNW_D and an effective wiring portion CNW_E may be repeated along the row direction. That is, a dummy portion CNW_D disposed on a first side of an effective wiring portion CNW_E in the first direction DR1 and a dummy portion CNW_D disposed on a second side of the effective wiring portion CNW_E in the first direction DR1 may be repeatedly arranged along one row.

In addition, each dummy portion CNW_D disposed in each inter-pixel row space PXT_R may belong to a connection wiring CNW disposed on a first side or a second side in the second direction DR2. In the same column, a dummy portion CNW_D belonging to a connection wiring CNW disposed on the first side in the second direction DR2 and a dummy portion CNW_D belonging to a connection wiring CNW disposed on the second side in the second direction DR2 may be alternately arranged along the first direction DR1.

As described above, a dummy portion CNW_D having a connection structure on one side and a dummy portion CNW_D having a connection structure on the other side are alternately arranged along the first direction DR1 and the second direction DR2. Therefore, the connection wirings CNW may generally be arranged in a pinwheel shape or a whirlwind shape. This wiring arrangement pattern may further prevent or mitigate a visual defect, thereby further improving visibility or display quality.

Figure 18:
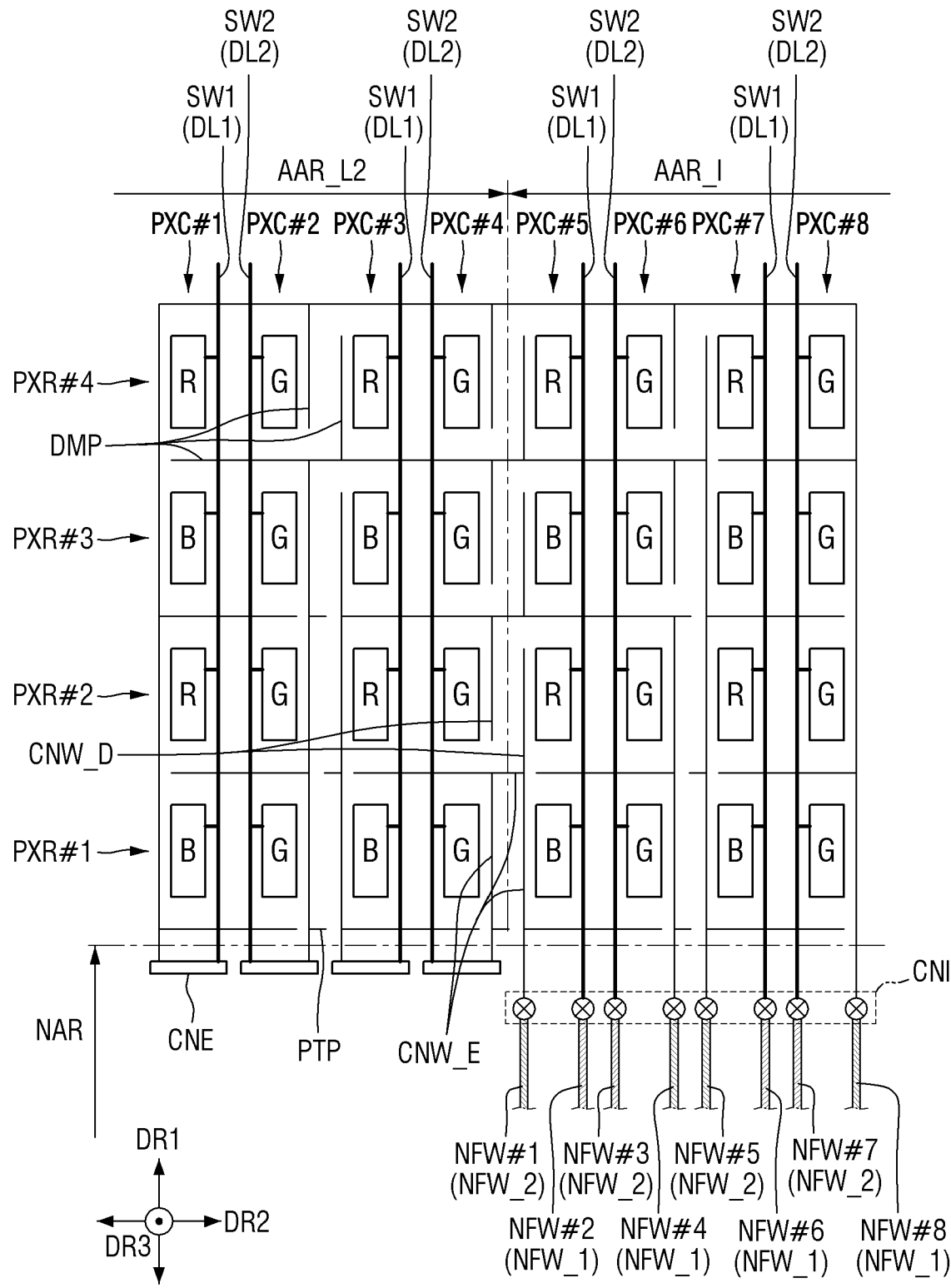
FIG. 18 is a partial layout view illustrating a pixel arrangement and a data line arrangement according to an exemplary embodiment.

FIG. 18 is a partial layout view illustrating a pixel arrangement and a data line arrangement according to an exemplary embodiment.

Referring to FIG. 18, a display device is different from the exemplary embodiments described in association with FIG. 17 in that each connection wiring CNW further includes protruding patterns PTP. The protruding patterns PTP may protrude in the second direction DR2 from a first-direction extension portion of each connection wiring CNW disposed in each inter-pixel column space PXT_C, for example, from a first extension portion CNW_1, a third extension portion CNW_3 or a dummy portion CNW_D extending in the first direction DR1. In one inter-pixel column space PXT_C, first-direction extension portions of two connection wirings CNW extend parallel to each other as described above. Here, the protruding patterns PTP of one of the connection wirings CNW may protrude toward the other connection wiring CNW. A protruding length of each of the protruding patterns PTP may be smaller than a width of each pixel PX in the first direction DR1, a width of each pixel PX in the second direction DR2, and a width of each inter-pixel space PXT.

The protruding patterns PTP of each connection wiring CNW may protrude to a point where they are spaced apart from an adjacent connection wiring CNW without contacting the adjacent connection wiring CNW. The protruding length of each protruding pattern PTP may be smaller than a distance between first-direction extension portions of two connection wirings CNW in one inter-pixel column space PXT_C. A protruding distance of each protruding pattern PTP of one connection wiring CNW may be, but is not limited to, greater than or equal to a distance between the connection wiring CNW and another connection wiring CNW facing the connection wiring CNW.

Each protruding pattern PTP may be disposed at an intersection of an inter-pixel column space PXT_C and an inter-pixel row space PXT_R, but exemplary embodiments are not limited to this case. Each protruding pattern PTP may be disposed on an extension of a portion of a connection wiring CNW passing through the same inter-pixel row space PXT_R as the protruding pattern PTP, for example, on an extension of a second extension portion CNW_2 or a dummy portion CNW_D extending in the second direction DR2. A protruding pattern PTP belonging to a connection wiring CNW located on a side in one inter-pixel column space PXT_C and a protruding pattern PTP belonging to a connection wiring located on the other side may be alternately and respectively arranged in the inter-pixel row spaces PXT_R.

Each inter-pixel row space PXT_R includes a region through which a second extension portion CNW_2 of a connection wiring CNW or a dummy portion CNW_D extending in the second direction DR2 passes. However, each inter-pixel row space PXT_R also includes a region through which the above wirings do not pass. For example, a second extension portion CNW_2 of a connection wiring CNW or a dummy portion CNW_D extending in the second direction DR2 is not disposed in each inter-pixel row space PXT_R through which first-direction extension portions of a pair of connection wirings CNW pass. In this case, since a second-direction extension portion does not exist in a space between the first-direction extension portions of the connection wirings CNW facing each other, a visual defect (or difference) in which the space is seen from the outside may occur. If a protruding pattern PTP protruding in the second direction DR2 is disposed in the space between the first-direction extension portions of the facing connection wirings CNW, visual defects can be minimized or reduced. Further, since connection structures of the protruding patterns PTP are alternately and respectively arranged in rows, visibility or display quality can be further improved.

Figure 19:
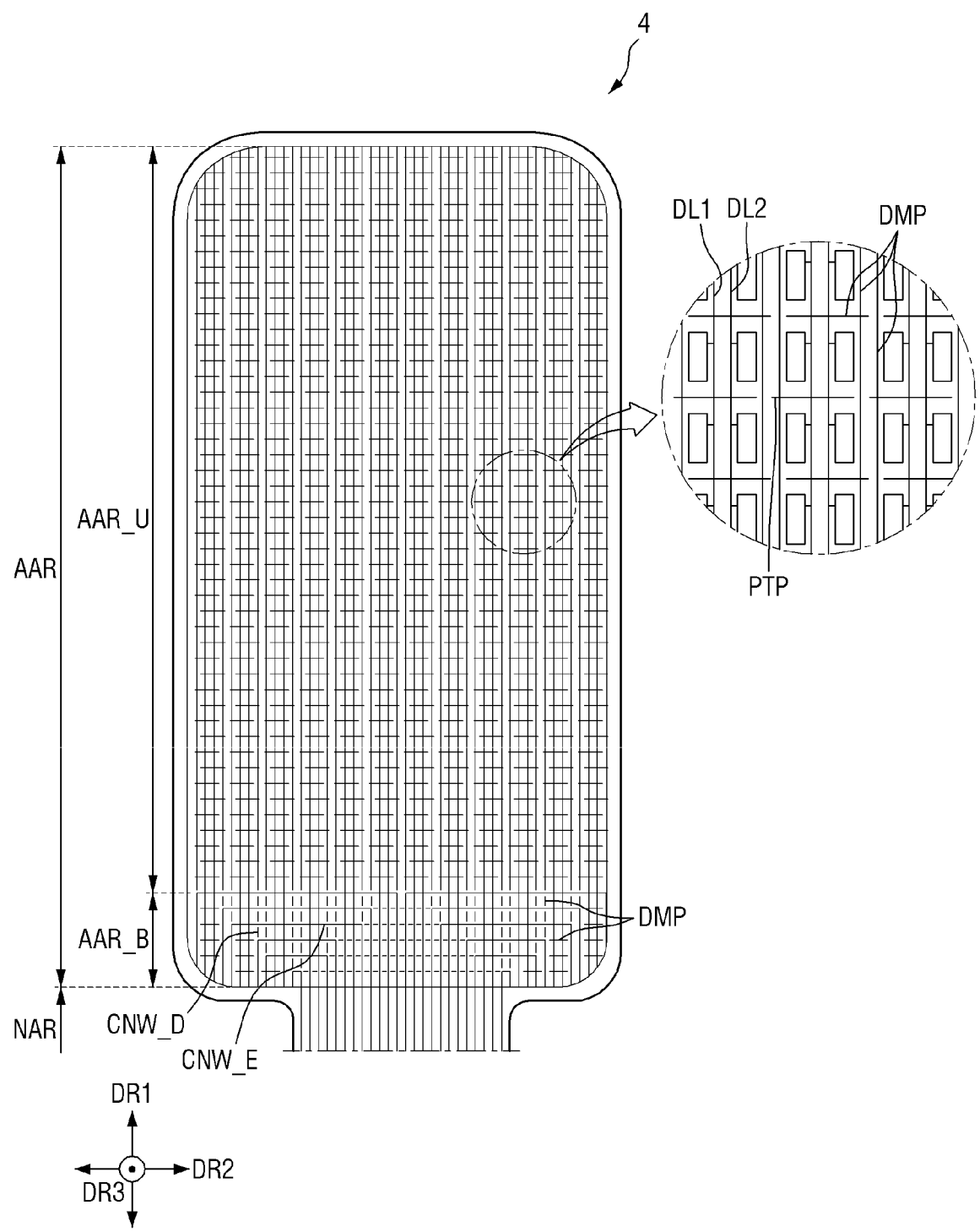
FIG. 19 is a schematic layout view illustrating a pixel arrangement and a data line arrangement according to an exemplary embodiment.

FIG. 19 is a schematic layout view illustrating a pixel arrangement and a data line arrangement according to an exemplary embodiment. FIG. 19 shows an example in which the wiring structure of FIG. 18 is applied to the entire display device.

Referring to FIG. 19, connection wirings CNW are disposed in a lower region AAR_B of an active region AAR of a display device 4 and are not disposed in an upper region AAR_U. In the lower region AAR_B, a dummy portion CNW_D is disposed in each inter-pixel space PXT in which an effective wiring portion CNW_E of a connection wiring CNW is not disposed. In addition, in the upper region AAR_U in which no connection wiring CNW is disposed, dummy wiring patterns DMP having substantially the same shape and arranged in substantially the same manner as the connection wirings CNW disposed in the lower region AAR_B are disposed. The dummy wiring patterns DMP may include protruding patterns PTP, like the connection wirings CNW of the lower region AAR_B. Although the dummy wiring patterns DMP of the upper region AAR_U are separated from the connection wirings CNW of the lower region AAR_B in the drawing, the dummy wiring patterns DMP may also be connected to the connection wirings CNW of the lower region AAR_B to form the dummy portions CNW_D.

As seen in FIG. 19, the connection wirings CNW including the dummy portions CNW_D disposed in the lower region AAR_B of the active region AAR and the dummy wiring patterns DMP disposed in the upper region AAR_U of the active region AAR may be generally in the shape of a plurality of pinwheel patterns. This wiring arrangement pattern may further prevent or mitigate a visual defect or difference, thereby further improving visibility or display quality.

Figure 20:
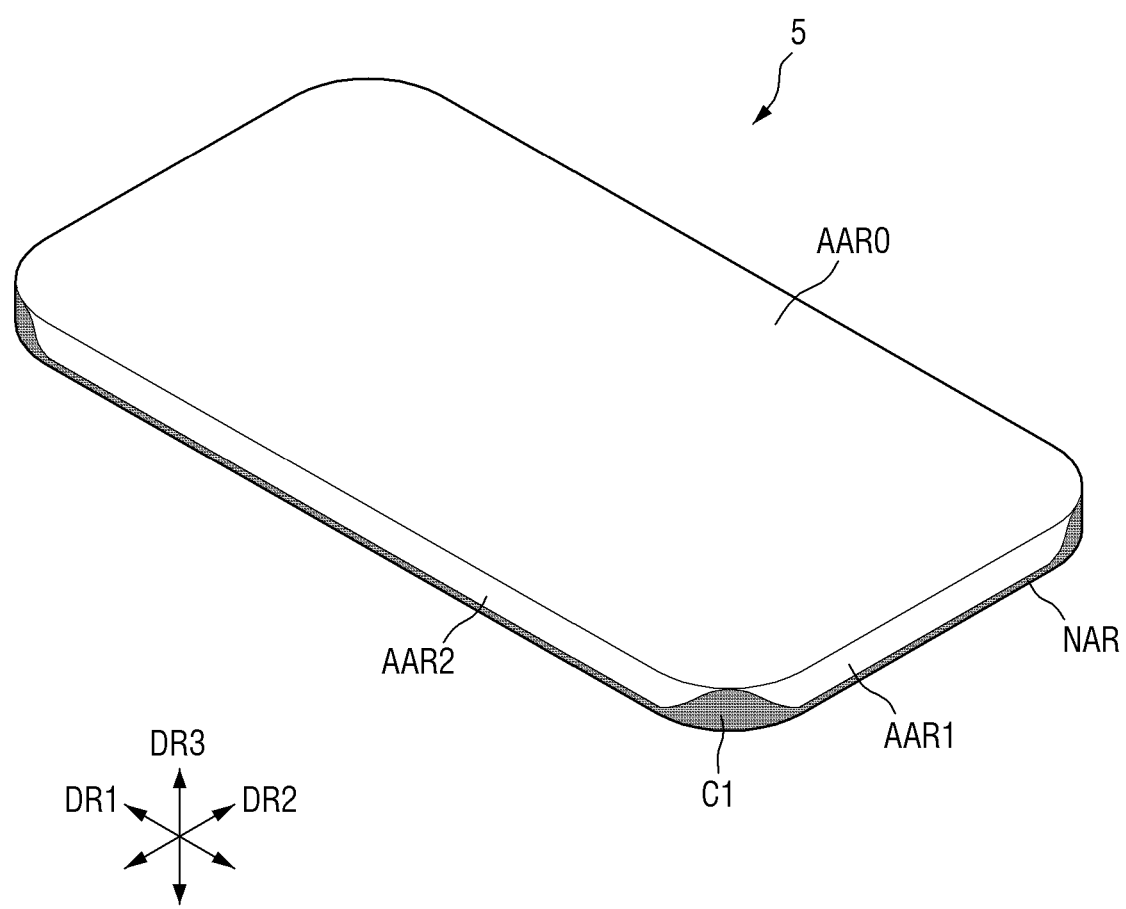
FIG. 20 is a perspective view of a display device according to an exemplary embodiment.
Figure 21:
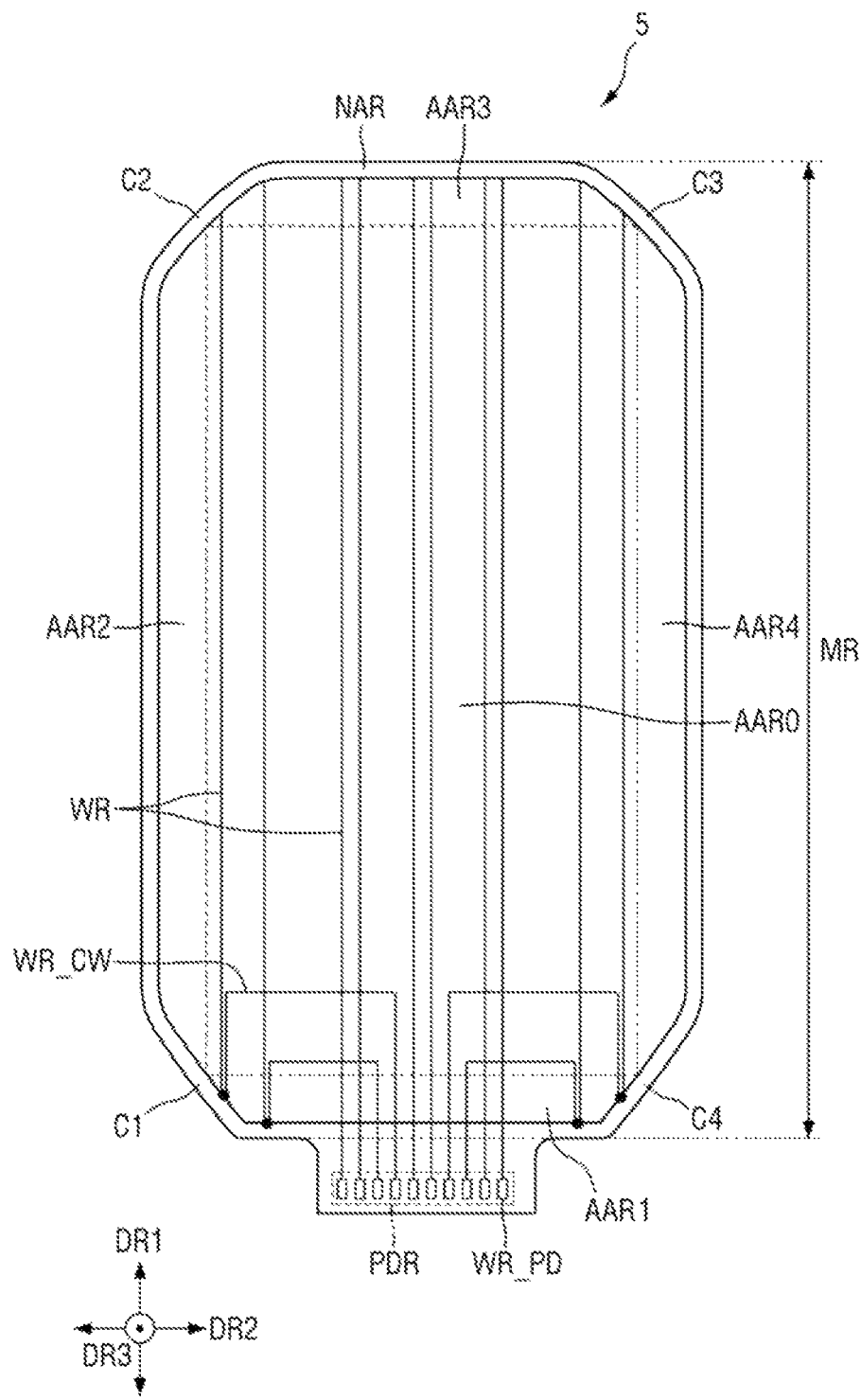
FIG. 21 is a development drawing of the display device of FIG. 20 according to an exemplary embodiment.

FIG. 20 is a perspective view of a display device 5 according to an exemplary embodiment. FIG. 21 is a development drawing of the display device 5 of FIG. 20 according to an exemplary embodiment. FIGS. 20 and 21 show that the display device 5 can be applied as a multi-faced display device.

Referring to FIGS. 20 and 21, the display device 5 according to an exemplary embodiment includes a front active region AAR0, side active regions AAR1 through AAR4, and corner regions C1 through C4.

The front active region AAR0 and the side active regions AAR1 through AAR4 may constitute an active region AAR where an image is displayed. The side active regions AAR1 through AAR4 may be bent at an angle of 30 to 120 degrees with respect to the front active region AAR0.

The corner regions C1 through C4 may be located between the side active regions AAR1 through AAR4. The corner regions C1 through C4 may include first through fourth corner regions C1 through C4 located between first through fourth side active regions AAR1 through AAR4, respectively. The first through fourth corner regions C1 through C4 may be located adjacent to four corners where long and short sides of the front active region AAR0 meet. The first through fourth corner regions C1 through C4 may be substantially the same in their function or configuration, except for their position. The corner regions C1 through C4 may constitute a non-active region NAR where no image is displayed and may provide spaces through which wirings pass.

In an exemplary embodiment, a width of a pad portion PDR is smaller than that of the entire active region AAR as described above with reference to FIG. 6. Therefore, straight wirings can be used to transmit signals to the first side active region AAR1, the front active region AAR0, and the third side active region AAR3 overlapping, in the first direction DR1, a region where wirings WR extending from the pad portion PDR are arranged. However, it is difficult to secure a space for straight wirings in the non-active region NAR to transmit signals to the second side active region AAR2 or the fourth side active region AAR4. In the case of the second side active region AAR2 or the fourth side active region AAR4, signals may be transmitted through circuitous wirings using bypass wirings WR_CN passing through the active region AAR as described above. Since this has been described above in detail, a redundant description thereof is omitted.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:
1. A display device comprising:
an active region comprising pixels configured to receive data signals from data lines, the pixels being arranged in a matrix formation;

a non-active region adjacent to the active region in a first direction, the non-active region comprising a pad portion;
non-active fan-out wirings in the non-active region and connected to the pad portion;
signal wirings extending in the first direction and crossing the active region, the signal wirings being connected to the pixels; and
connection wirings at least partially passing through the active region and connecting some of the non-active fan-out wirings to some of the signal wirings, respectively,
wherein the non-active fan-out wirings comprise:
first non-active fan-out wirings made of a first conductive layer; and
second non-active fan-out wirings made of a second conductive layer different from the first conductive layer,
wherein the first non-active fan-out wirings and the second non-active fan-out wirings are alternately arranged along a second direction intersecting the first direction, and
wherein each of the connection wirings comprises:
a first extension portion in an inter-pixel column space between adjacent pixels among the pixels;
a second extension portion connected to the first extension portion, the second extension portion being in an inter-pixel row space between adjacent pixels among the pixels; and
a third extension portion connected to the second extension portion, the third extension portion being in an inter-pixel column space between adjacent pixels among the pixels.

2. The display device of claim 1, wherein:
the matrix formation comprises first pixel columns and second pixel columns alternately arranged;
the first pixel columns are pixel columns in which a first color pixel and a second color pixel are alternately arranged; and
the second pixel columns are pixel columns in which a third color pixel is repeatedly arranged.

3. The display device of claim 2, wherein:
signal wirings connected to the first non-active fan-out wirings among the signal wirings are connected to the first pixel columns; and
signal wirings connected to the second non-active fan-out wirings among the signal wirings are connected to the second pixel columns.

4. The display device of claim 2, wherein:
the data signals comprise a first data signal and a second data signal; and
the data lines comprise:
first data lines comprising the first non-active fan-out wirings and being configured to provide the first data signal to the first pixel columns; and
second data lines comprising the second non-active fan-out wirings and being configured to provide the second data signal to the second pixel columns.

5. The display device of claim 1, wherein the active region is divided into:
an inner active region overlapping the non-active fan-out wirings extending in the first direction; and
an outer active region not overlapping the non-active fan-out wirings extending in the first direction.

6. The display device of claim 5, wherein:
signal wirings disposed in the inner active region are direct signal wirings directly connected to the non-active fan-out wirings; and
signal wirings disposed in the outer active region are indirect signal wirings connected to the non-active fan-out wirings through the connection wirings.

7. The display device of claim 6, wherein a pair of fan-out wirings connected to the direct signal wirings and a pair of fan-out wirings connected to the indirect signal wirings are alternately arranged along the second direction.

8. A display device comprising:
an active region comprising pixels configured to receive data signals from data lines, the pixels being arranged in a matrix formation;
a non-active region adjacent to the active region in a first direction, the non-active region comprising a pad portion;
non-active fan-out wirings in the non-active region and connected to the pad portion;
signal wirings extending in the first direction and crossing the active region, the signal wirings being connected to the pixels; and
connection wirings at least partially passing through the active region and connecting some of the non-active fan-out wirings to some of the signal wirings, respectively,
wherein the non-active fan-out wirings comprise:
first non-active fan-out wirings made of a first conductive layer; and
second non-active fan-out wirings made of a second conductive layer different from the first conductive layer,
wherein the first non-active fan-out wirings and the second non-active fan-out wirings are alternately arranged along a second direction intersecting the first direction, and
wherein:
the signal wirings are made of a third conductive layer;
the connection wirings are made of a fourth conductive layer;
the first conductive layer, the second conductive layer, the third conductive layer, and the fourth conductive layer are different conductive layers.

9. The display device of claim 8, wherein the signal wirings are disposed in inter-pixel column spaces between adjacent pixels among the pixels.

10. The display device of claim 9, wherein each of the connection wirings comprises:
a first extension portion in an inter-pixel column space between adjacent pixels among the pixels;
a second extension portion connected to the first extension portion and in an inter-pixel row space between adjacent pixels among the pixels; and
a third extension portion connected to the second extension portion and disposed in an inter-pixel column space between adjacent pixels among the pixels.

11. The display device of claim 10, wherein the inter-pixel column spaces in which the signal wirings are disposed are different from the inter-pixel column spaces in which the first extension portion or the third extension portion is disposed.

12. The display device of claim 11, wherein the inter-pixel column spaces in which the signal wirings are disposed and the inter-pixel column space in which the first extension portion or the third extension portion is disposed are alternately arranged along a row direction.

13. The display device of claim 10, wherein the first extension portion contacts a corresponding non-active fan-out wiring among the non-active fan-out wirings in the non-active region.

14. The display device of claim 10, wherein the third extension portion is connected to a corresponding signal wiring among the signal wirings in the non-active region.

15. The display device of claim 14, further comprising:
a contact electrode in the non-active region,
wherein:
the contact electrode is made of the first conductive layer or the second conductive layer; and
the contact electrode is connected to each of the third extension portion and the corresponding signal wiring.

16. The display device of claim 10, wherein each of the connection wirings comprises:
an effective wiring portion comprising the first extension portion, the second extension portion, and the third extension portion; and
a dummy portion branching from the effective wiring portion, the dummy portion being in an inter-pixel space between adjacent pixels among the pixels.

17. The display device of claim 16, wherein:
each of the connection wirings further comprises a protruding pattern protruding toward an adjacent connection wiring among the connection wirings; and
a protruding length of the protruding pattern is smaller than a width of each pixel and a width of the inter-pixel space.

18. The display device of claim 8, further comprising:
a dummy wiring pattern made of the fourth conductive layer, disposed in an inter-pixel space in which the signal wirings and the connection wirings are not disposed, and separate from the connection wirings.

19. A display device having an active region and a non-active region adjacent to the active region in a first direction, the display device comprising:
non-active fan-out wirings in the non-active region, the non-active fan-out wirings comprising first non-active fan-out wirings and second non-active fan-out wirings alternately arranged along a second direction intersecting the first direction;
signal wirings in the active region, the signal wirings comprising first signal wirings and second signal wirings alternately arranged along the second direction; and
active fan-out wirings passing through the active region,
wherein:
the first non-active fan-out wirings are made of a first conductive layer;
the second non-active fan-out wirings are made of a second conductive layer;
the signal wirings are made of a third conductive layer;
the active fan-out wirings are made of a fourth conductive layer;
the first conductive layer, the second conductive layer, the third conductive layer, and the fourth conductive layer are different conductive layers;
a first portion of the first signal wirings is connected to the first non-active fan-out wirings through the active fan-out wirings to form first outer data lines;
a remaining portion of the first signal wirings is connected to the first non-active fan-out wirings without the active fan-out wirings to form first inner data lines;
a first portion of the second signal wirings is connected to the second non-active fan-out wirings through the active fan-out wirings to form second outer data lines; and
a remaining portion of the second signal wirings is connected to the second non-active fan-out wirings without the active fan-out wirings to form second inner data lines.

20. The display device of claim 19, wherein the active region comprises an inner active region and an outer active region adjacent to the inner active region in the second direction.

21. The display device of claim 20, wherein:
the first and second signal wirings of the inner data lines are alternately arranged in the inner active region along the second direction; and
the first and second signal wirings of the outer data lines are alternately arranged in the outer active region along the second direction.

22. The display device of claim 21, wherein:
each of the inner active region and the outer active region comprises first color pixel columns and second color pixel columns alternately arranged along the second direction;
the first pixel columns are pixel columns in which a first color pixel and a second color pixel are alternately arranged along the first direction; and
the second pixel columns are pixel columns in which a third color pixel is repeatedly arranged in the first direction.

23. The display device of claim 22, wherein:
the first color pixel columns of the inner active region are connected to the first signal wirings of the first inner data lines;
the second color pixel columns of the inner active region are connected to the second signal wirings of the second inner data lines;
the first color pixel columns of the outer active region are connected to the first signal wirings of the first outer data lines; and
the second color pixel columns of the outer active region are connected to the second signal wirings of the second outer data lines.

\* \* \* \* \*